US012701901B2

(12) United States Patent
Yamazaki et al.

(10) Patent No.: US 12,701,901 B2
(45) Date of Patent: Aug. 4, 2026

(54) METHOD FOR MANUFACTURING DISPLAY DEVICE, DISPLAY DEVICE, DISPLAY MODULE, AND ELECTRONIC DEVICE

(71) Applicant: Semiconductor Energy Laboratory Co., Ltd., Atsugi (JP)

(72) Inventors: Shunpei Yamazaki, Setagaya (JP); Takayuki Ikeda, Atsugi (JP); Kenichi Okazaki, Atsugi (JP); Yasumasa Yamane, Atsugi (JP); Hajime Kimura, Atsugi (JP); Tatsuya Onuki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 425 days.

(21) Appl. No.: 18/271,962

(22) PCT Filed: Jan. 11, 2022

(86) PCT No.: PCT/IB2022/050160
§ 371 (c)(1),
(2) Date: Jul. 12, 2023

(87) PCT Pub. No.: WO2022/157595
PCT Pub. Date: Jul. 28, 2022

(65) Prior Publication Data
US 2024/0188378 A1 Jun. 6, 2024

(30) Foreign Application Priority Data

Jan. 22, 2021 (JP) ................................. 2021-008410

(51) Int. Cl.
H10K 59/122 (2023.01)
H10K 50/00 (2023.01)
(Continued)

(52) U.S. Cl.
CPC ....... *H10K 59/80522* (2023.02); *H10K 50/00* (2023.02); *H10K 59/00* (2023.02);
(Continued)

(58) Field of Classification Search
CPC ....... H10K 59/351–353; H10K 59/122; H10K 59/80522
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001653855 A 8/2005
CN 102760698 A 10/2012
(Continued)

OTHER PUBLICATIONS

International Search Report (Application No. PCT/IB2022/050160) Dated Apr. 26, 2022.
(Continued)

*Primary Examiner* — Eric K Ashbahian
(74) *Attorney, Agent, or Firm* — Eric J. Robinson; Robinson Intellectual Property Law Office, P.C.

(57) ABSTRACT

A high-resolution or high-definition display device is provided. The display device is manufactured by forming a plurality of first pixel electrodes aligned in a first direction and a plurality of second pixel electrodes aligned in the first direction so that the plurality of first pixel electrodes and the plurality of second pixel electrodes are aligned in a second direction; forming a first layer and a first sacrificial layer; processing the first layer and the first sacrificial layer to expose at least part of the second pixel electrodes; forming a second layer and a second sacrificial layer; processing the
(Continued)

second layer and the second sacrificial layer to expose at least part of the first sacrificial layer; removing the first sacrificial layer and the second sacrificial layer; forming a third layer and a counter electrode; removing at least part of each of the third layer and the counter electrode included in a region between the adjacent pixel electrodes in a top view; forming a protective layer over the counter electrode; processing the protective layer to expose at least part of the counter electrode that overlaps with the pixel electrodes; and forming a conductive layer over the counter electrode and the protective layer.

15 Claims, 22 Drawing Sheets

(51) Int. Cl.
| | |
|---|---|
| *H10K 59/00* | (2023.01) |
| *H10K 59/12* | (2023.01) |
| *H10K 59/80* | (2023.01) |

(52) U.S. Cl.
CPC ... *H10K 59/1201* (2023.02); *H10K 59/80515* (2023.02); *H10K 59/873* (2023.02)

(56) References Cited

U.S. PATENT DOCUMENTS

| | | | |
|---|---|---|---|
| 7,534,557 | B2 | 5/2009 | Tachikawa et al. |
| 7,914,976 | B2 | 3/2011 | Tachikawa et al. |
| 8,358,057 | B2 | 1/2013 | Oota |
| 8,871,537 | B2 | 10/2014 | Yoshitoku et al. |
| 8,907,331 | B2 | 12/2014 | Jinta et al. |
| 9,082,733 | B2 | 7/2015 | Jinta et al. |
| 9,219,253 | B2 | 12/2015 | Izumi et al. |
| 11,678,550 | B2 | 6/2023 | Kato |
| 12,096,671 | B2 | 9/2024 | Kato |
| 2002/0072139 | A1 | 6/2002 | Kashiwabara |
| 2005/0153058 | A1 | 7/2005 | Tachikawa et al. |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2014/0034921 | A1 | 2/2014 | Jinta et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0155790 | A1 | 6/2016 | Lee et al. |
| 2016/0172595 | A1 | 6/2016 | Malinowski et al. |
| 2016/0247863 | A1* | 8/2016 | Choung ................. H10K 59/35 |
| 2016/0315133 | A1 | 10/2016 | Sato |
| 2017/0141167 | A1 | 5/2017 | Naganuma |
| 2017/0250236 | A1 | 8/2017 | Xiong et al. |
| 2017/0256754 | A1 | 9/2017 | Defranco et al. |
| 2017/0271612 | A1 | 9/2017 | Matsuzawa |
| 2018/0190908 | A1 | 7/2018 | Ke et al. |
| 2020/0203662 | A1 | 6/2020 | Mollard et al. |
| 2021/0265432 | A1 | 8/2021 | Kato |
| 2022/0130918 | A1 | 4/2022 | Yamazaki et al. |
| 2024/0057428 | A1* | 2/2024 | Yamazaki .............. H05B 33/12 |
| 2025/0008802 | A1 | 1/2025 | Kato |

FOREIGN PATENT DOCUMENTS

| | | |
|---|---|---|
| CN | 103035851 A | 4/2013 |
| CN | 103579289 A | 2/2014 |
| CN | 105655375 A | 6/2016 |
| CN | 112314056 A | 2/2021 |
| EP | 3029751 A | 6/2016 |
| JP | 2000-036385 A | 2/2000 |
| JP | 2003-059663 A | 2/2003 |
| JP | 2003-332051 A | 11/2003 |
| JP | 2008-098106 A | 4/2008 |
| JP | 2008-147072 A | 6/2008 |
| JP | 2008-251270 A | 10/2008 |
| JP | 2009-125501 A | 6/2009 |
| JP | 2012-160473 A | 8/2012 |
| JP | 2012-238580 A | 12/2012 |
| JP | 2013-084579 A | 5/2013 |
| JP | 2014-029814 A | 2/2014 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2017-168397 A | 9/2017 |
| JP | 2019-125501 A | 7/2019 |
| JP | 2019-179696 A | 10/2019 |
| JP | 2020-160305 A | 10/2020 |
| KR | 10-0931279 | 12/2009 |
| KR | 2013-0035898 A | 4/2013 |
| KR | 2016-0066673 A | 6/2016 |
| WO | WO-2003/096754 | 11/2003 |
| WO | WO-2017/119068 | 7/2017 |
| WO | WO-2018/087625 | 5/2018 |
| WO | WO-2020/004086 | 1/2020 |

OTHER PUBLICATIONS

Written Opinion (Application No. PCT/IB2022/050160) Dated Apr. 26, 2022.

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

(56)            References Cited

OTHER PUBLICATIONS

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

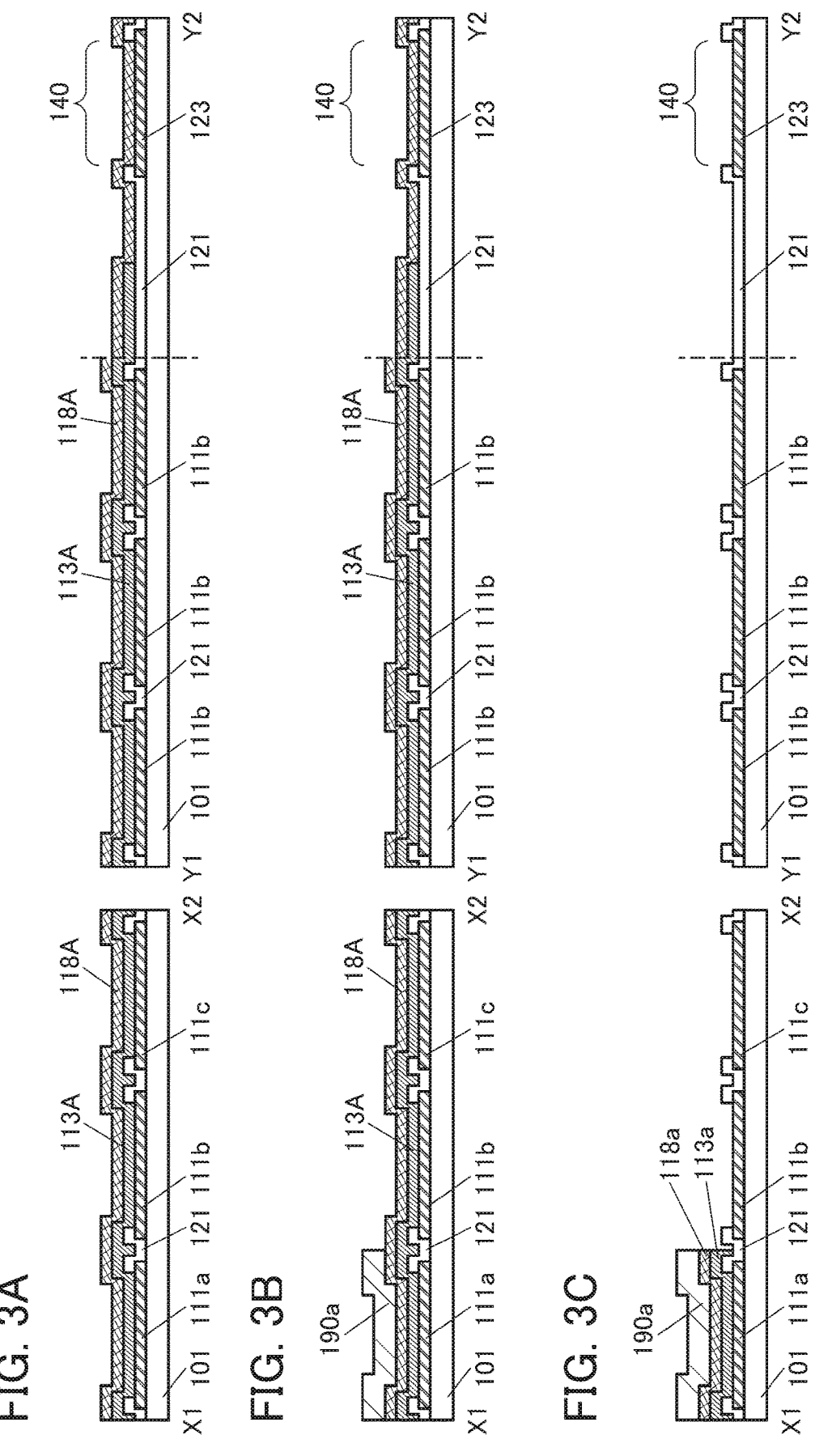

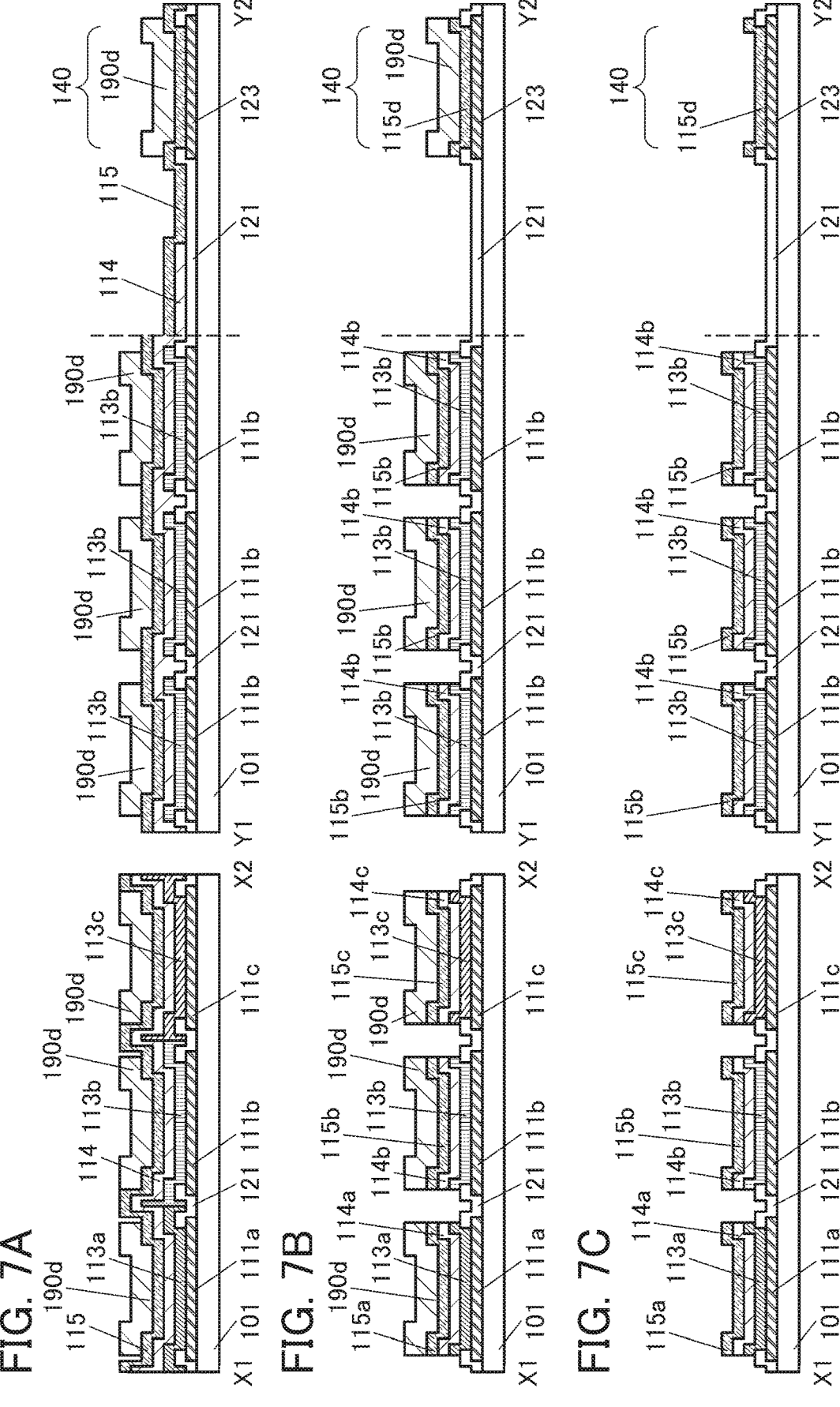

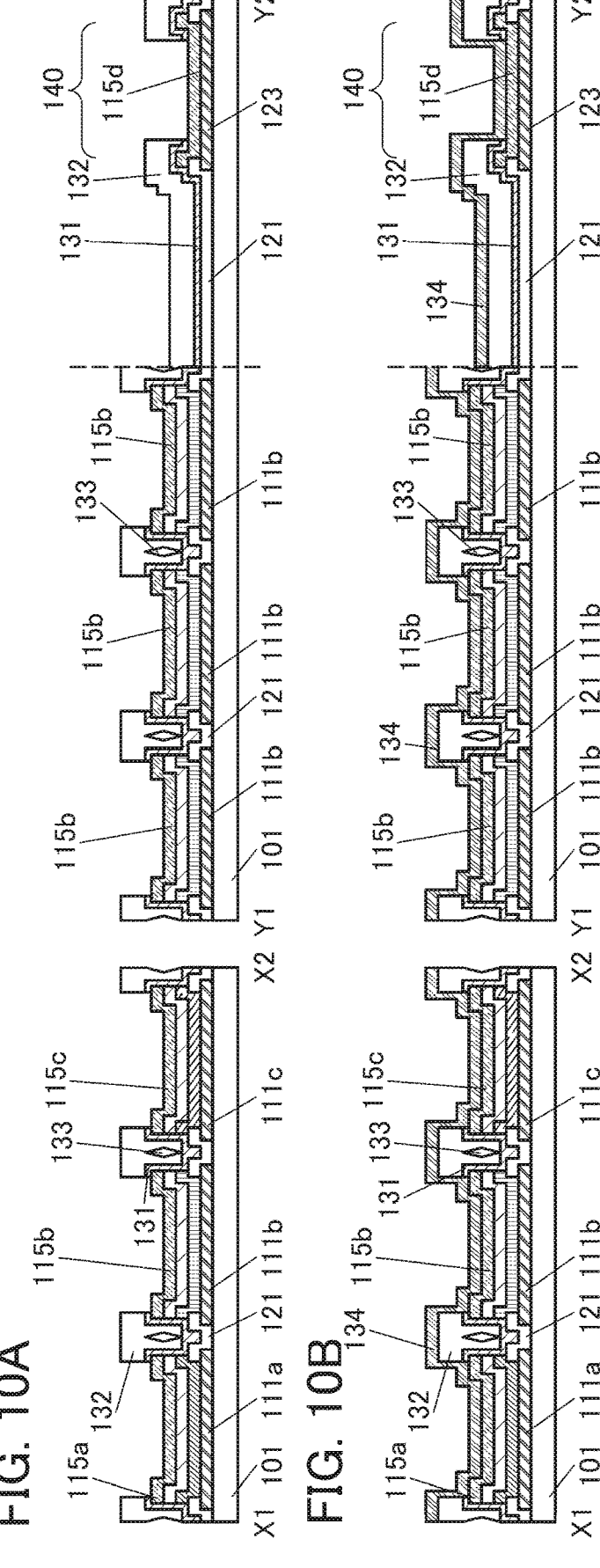

FIG. 17A
788
786 {
4420
4411
4430
772
FIG. 17B
788
786 {
4422
4421
4411
4432
4431
772
FIG. 17C
788
786 {
4420
4411
4412
4413
4430
772
FIG. 17D
788
786a {
4420
4411
4430
4440
786b {
4420
4412
4430
772
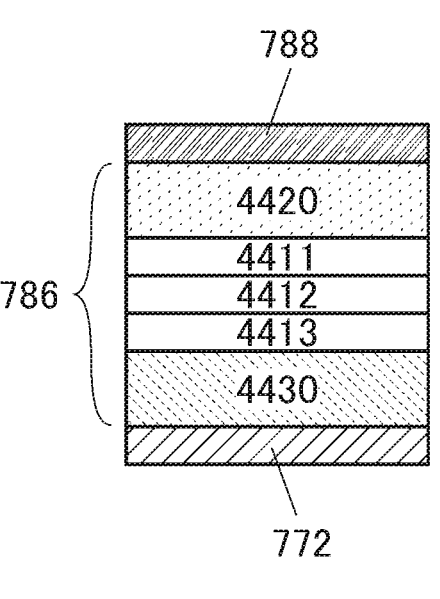
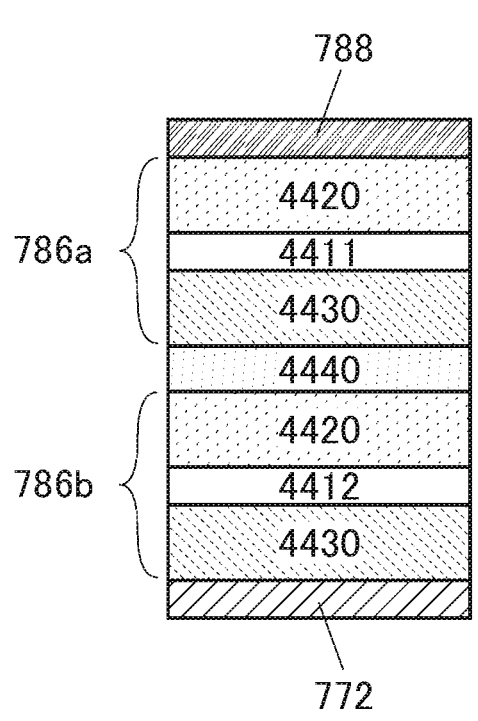

FIG. 18A
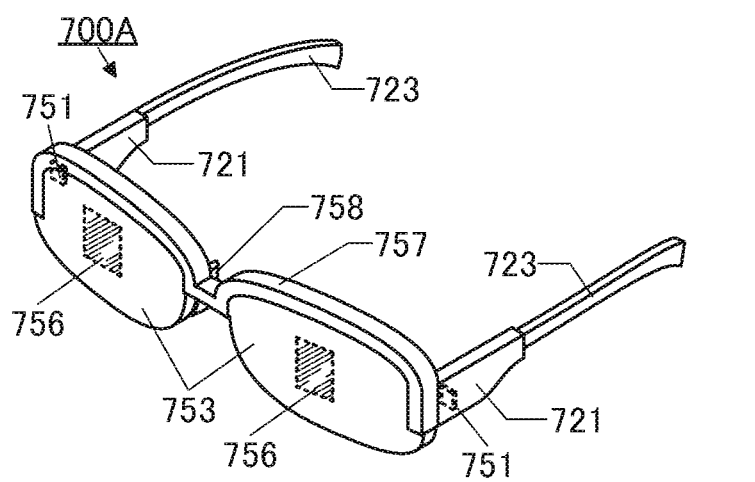
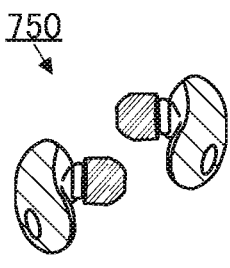
FIG. 18B
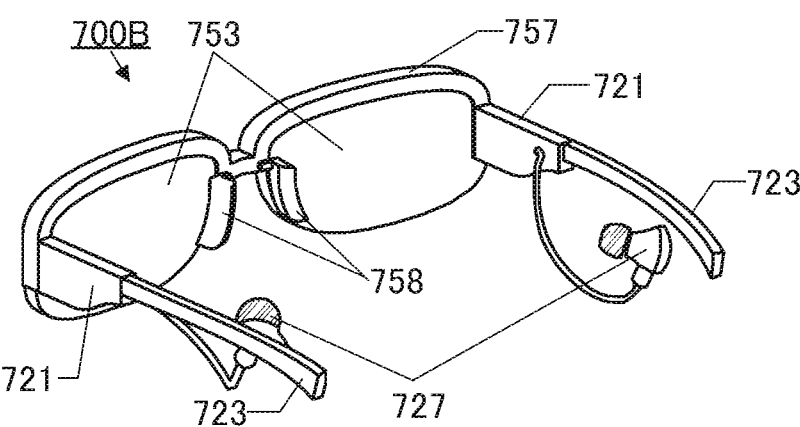

FIG. 19A
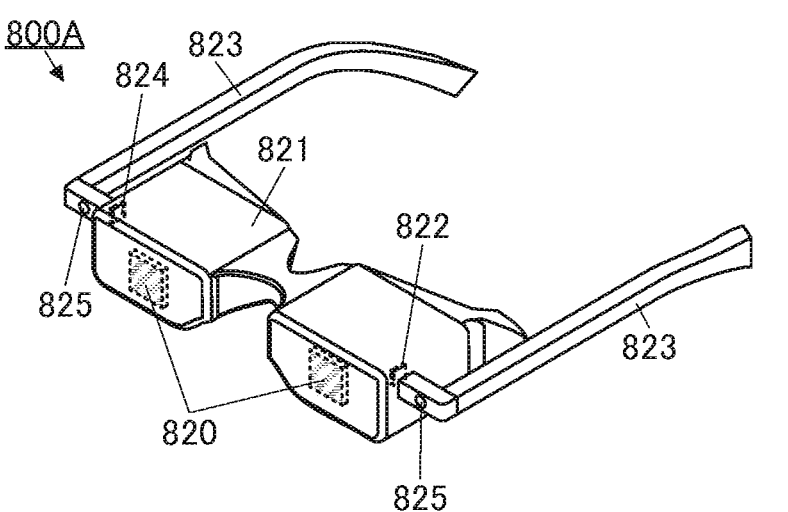
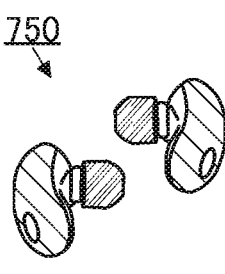
FIG. 19B
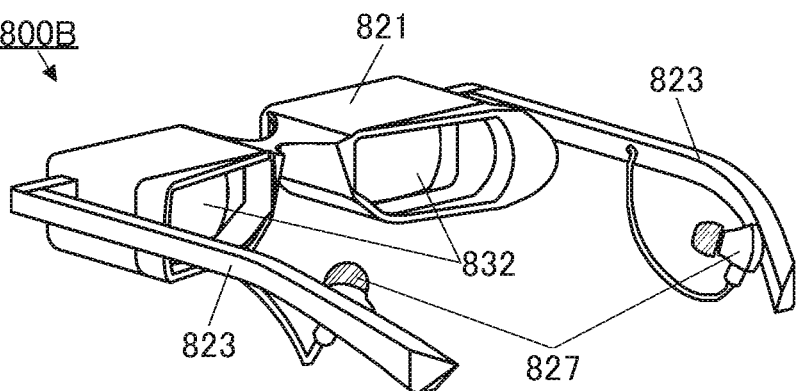

FIG. 21A
FIG. 21B
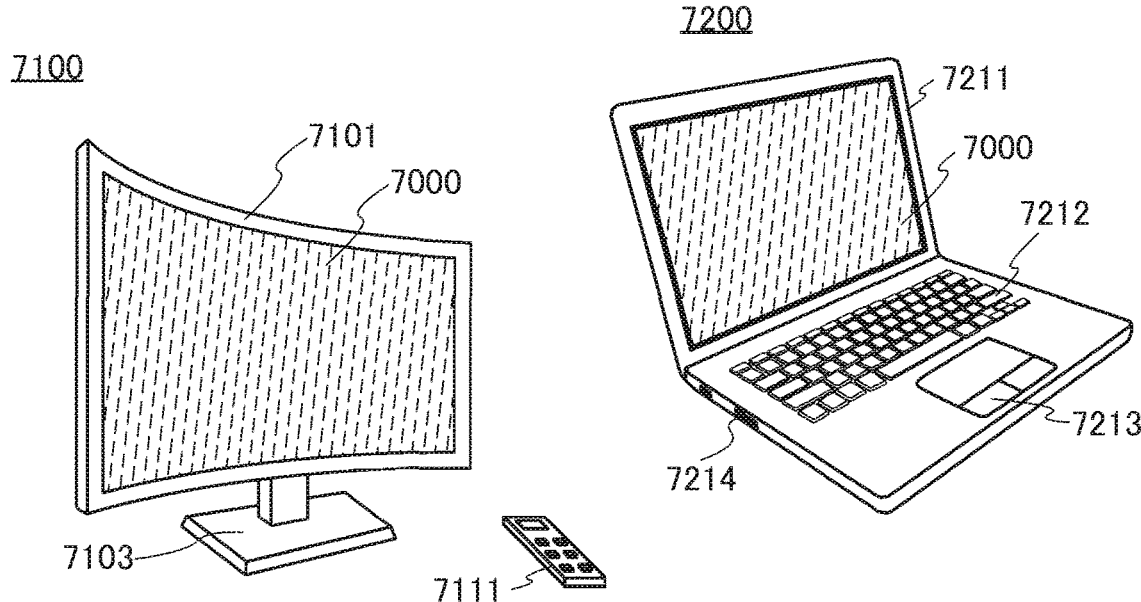
FIG. 21C
FIG. 21D
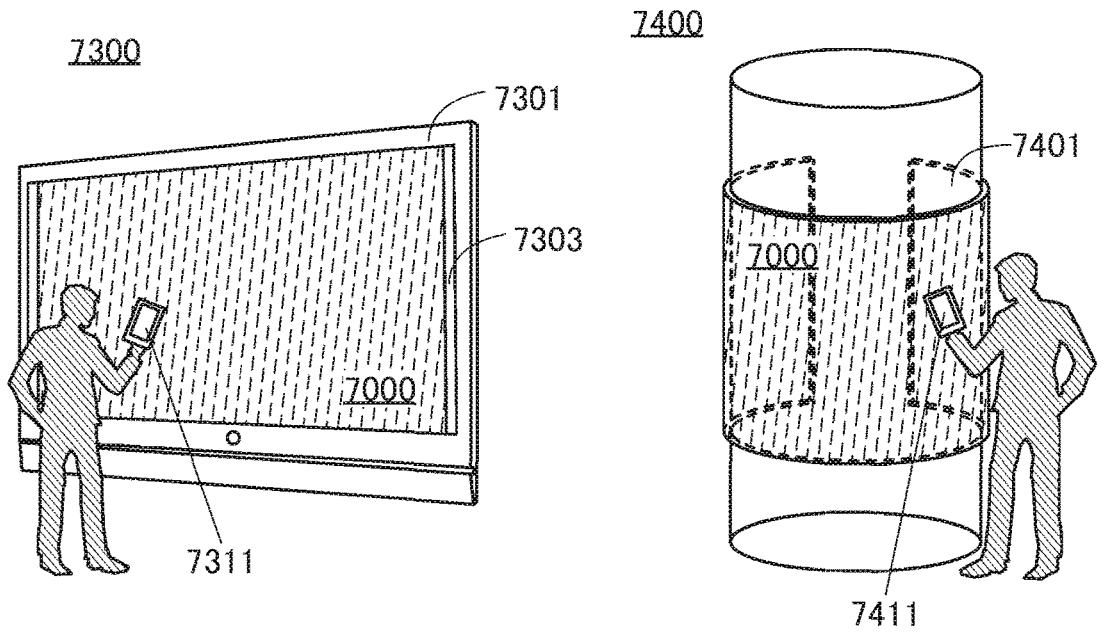

FIG. 22A
9101
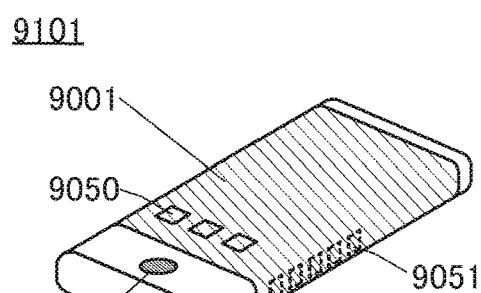
FIG. 22C
9200
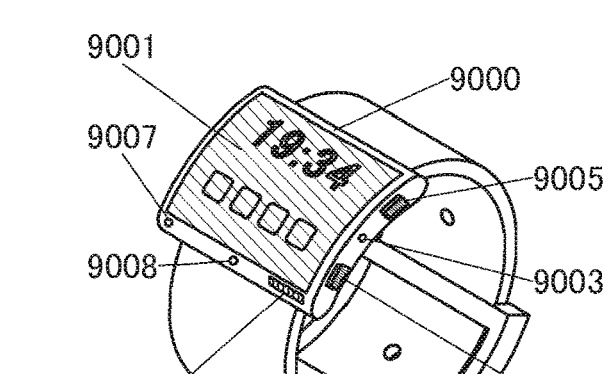
FIG. 22B
9102
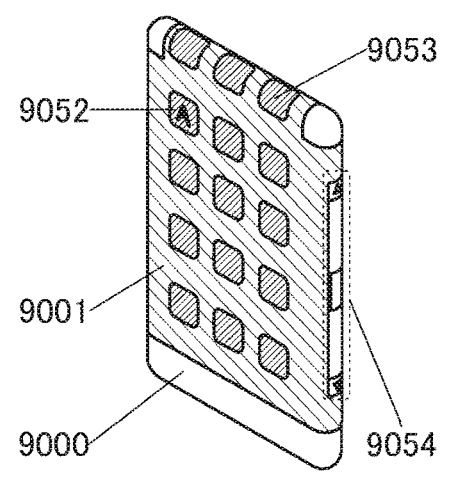
FIG. 22D
9201
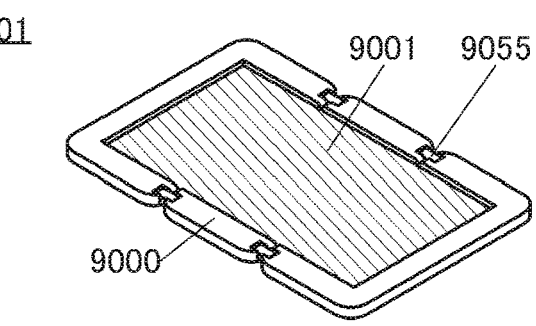
FIG. 22E
9201
FIG. 22F
9201
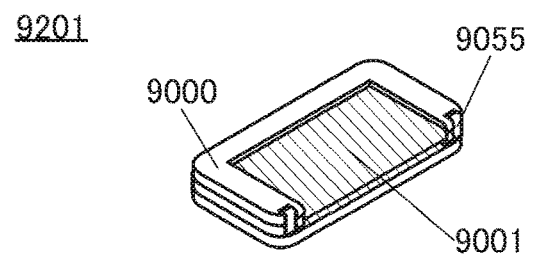

METHOD FOR MANUFACTURING DISPLAY DEVICE, DISPLAY DEVICE, DISPLAY MODULE, AND ELECTRONIC DEVICE

TECHNICAL FIELD

One embodiment of the present invention relates to a method for manufacturing a display device. One embodiment of the present invention relates to a display device, a display module, and an electronic device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a method for driving any of them, and a method for manufacturing any of them.

BACKGROUND ART

In recent years, display devices have been expected to be applied to a variety of uses. Examples of uses for a large display device include a television device for home use (also referred to as a TV or a television receiver), digital signage, and a PID (Public Information Display). In addition, a smartphone, a tablet terminal, and the like including a touch panel are being developed as portable information terminals.

Furthermore, display devices have been required to have higher resolution. For example, devices for virtual reality (VR), augmented reality (AR), substitutional reality (SR), or mixed reality (MR) are given as devices requiring high-resolution display devices and have been actively developed.

Light-emitting apparatuses including light-emitting devices (also referred to as light-emitting elements) have been developed as display devices, for example. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display devices.

Patent Document 1 discloses a display device for VR using an organic EL device (also referred to as an organic EL element).

REFERENCE

Patent Document

[Patent Document 1] PCT International Publication No. 2018/087625

SUMMARY OF THE INVENTION

Problems to be Solved by the Invention

In the case of manufacturing a display device including a plurality of organic EL devices including light-emitting layers emitting light of different colors, the light-emitting layers emitting light of different colors each need to be formed in an island shape.

For example, an island-shaped light-emitting layer can be formed by a vacuum evaporation method using a metal mask (also referred to as a shadow mask). However, the outline of the layer may blur during vapor deposition, whereby the thickness of an end portion may be small. That is, the thickness of an island-shaped light-emitting layer may vary from area to area. In the case of manufacturing a display device with a large size, high definition, or high resolution, the manufacturing yield might be reduced because of low dimensional accuracy of the metal mask and deformation due to heat or the like.

In the case of manufacturing a display device by a vacuum evaporation method using a metal mask, there is a problem in that a plurality of manufacturing equipment lines are required. For example, since a metal mask needs to be cleaned regularly, at least two or more manufacturing equipment lines are prepared so that one of the equipment lines is used for device fabrication while the other equipment line is being under maintenance; in consideration of mass production, a plurality of manufacturing equipment lines are required. Thus, the issue is that the initial investment for introducing manufacturing equipment significantly increases.

An object of one embodiment of the present invention is to provide a method for manufacturing a high-resolution display device. An object of one embodiment of the present invention is to provide a method for manufacturing a high-definition display device. An object of one embodiment of the present invention is to provide a method for manufacturing a large display device. An object of one embodiment of the present invention is to provide a method for manufacturing a highly reliable display device. An object of one embodiment of the present invention is to provide a method for manufacturing a display device at a high yield.

An object of one embodiment of the present invention is to provide a high-resolution display device. An object of one embodiment of the present invention is to provide a high-definition display device. An object of one embodiment of the present invention is to provide a large display device. An object of one embodiment of the present invention is to provide a highly reliable display device.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a method for manufacturing a display device, including: forming a plurality of first pixel electrodes aligned in a first direction and a plurality of second pixel electrodes aligned in the first direction so that the plurality of first pixel electrodes and the plurality of second pixel electrodes are aligned in a second direction; forming a first layer over the plurality of first pixel electrodes and the plurality of second pixel electrodes; forming a first sacrificial layer over the first layer; processing the first layer and the first sacrificial layer to expose at least part of each of the plurality of second pixel electrodes; forming a second layer over the plurality of first pixel electrodes and the plurality of second pixel electrodes; forming a second sacrificial layer over the second layer; processing the second layer and the second sacrificial layer to expose at least part of the first sacrificial layer; removing the first sacrificial layer and the second sacrificial layer; forming a third layer over the plurality of first pixel electrodes and the plurality of second pixel electrodes; forming a counter electrode over the third layer; processing the third layer and the counter electrode to remove at least part of each of the third layer and the counter electrode included in a region between the first pixel electrode and the second pixel electrode, a region between the plurality of first pixel electrodes, and a region between the plurality of second pixel electrodes in a top view; forming a protective layer over the counter electrode; processing the protective layer to expose at least part of the counter electrode that overlaps with the first pixel electrode and at least part of the counter electrode that overlaps with the second pixel electrode; and forming a conductive layer over the counter electrode and the protective layer.

A first protective layer may be formed by a first deposition method and a second protective layer may be formed by a second deposition method. The first deposition method may be a deposition method that allows a film to be formed at higher coverage than the second deposition method.

Before the formation of the first layer, an insulating layer covering end portions of the plurality of first pixel electrodes and end portions of the plurality of second pixel electrodes may be formed. At least part of the insulating layer may be exposed in the step of processing the third layer and the counter electrode.

A first resist mask overlapping with the first pixel electrode is preferably formed over the first sacrificial layer and used in the processing of the first layer and the first sacrificial layer. A second resist mask overlapping with the second pixel electrode is preferably formed over the second sacrificial layer and used in the processing of the second layer and the second sacrificial layer.

A third resist mask, which includes a first part overlapping with the first pixel electrode and a second part overlapping with the second pixel electrode and apart from the first part, is preferably formed over the counter electrode. The third resist mask is preferably used in the processing of the third layer and the counter electrode.

A fourth resist mask, which includes an opening in a region overlapping with the first pixel electrode and in a region overlapping with the second pixel electrode, is preferably formed over the protective layer. The fourth resist mask is preferably used in the processing of the protective layer.

One embodiment of the present invention is a display device including a plurality of first light-emitting devices, a plurality of second light-emitting devices, a protective layer over the plurality of first light-emitting devices and the plurality of second light-emitting devices, and a conductive layer over the protective layer. The first light-emitting devices each include a first pixel electrode, a first layer over the first pixel electrode, a third layer over the first layer, and a counter electrode over the third layer. The second light-emitting devices each include a second pixel electrode, a second layer over the second pixel electrode, the third layer over the second layer, and the counter electrode over the third layer. The first light-emitting devices and the second light-emitting devices have a function of emitting light of different colors from each other. A region between the first pixel electrode and the second pixel electrode in a top view includes a first part where the third layer and the counter electrode are not provided. A region between two first pixel electrodes in the top view includes a second part where the third layer and the counter electrode are not provided. A region between two second pixel electrodes in the top view includes a third part where the third layer and the counter electrode are not provided. The counter electrode is electrically connected to the conductive layer in a region overlapping with the first pixel electrode or the second pixel electrode.

The above display device may include a space surrounded by the protective layer between the first light-emitting device and the second light-emitting device.

Alternatively, the above display device preferably includes a first protective layer over the counter electrode and a second protective layer over the first protective layer. A space surrounded by the first protective layer and the second protective layer may be included between the first light-emitting device and the second light-emitting device.

One embodiment of the present invention is a display module including the display device having any of the above-described structures and is, for example, a display module provided with a connector such as a flexible printed circuit (hereinafter referred to as an FPC) or a TCP (Tape Carrier Package), or a display module on which an integrated circuit (IC) is mounted by a COG (Chip On Glass) method, a COF (Chip On Film) method, or the like.

One embodiment of the present invention is an electronic device including the above-described display module and at least one of a housing, a battery, a camera, a speaker, and a microphone.

Effect of the Invention

With one embodiment of the present invention, a method for manufacturing a high-resolution display device can be provided. With one embodiment of the present invention, a method for manufacturing a high-definition display device can be provided. With one embodiment of the present invention, a method for manufacturing a large display device can be provided. With one embodiment of the present invention, a method for manufacturing a highly reliable display device can be provided. With one embodiment of the present invention, a method for manufacturing a display device at a high yield can be provided.

With one embodiment of the present invention, a high-resolution display device can be provided. With one embodiment of the present invention, a high-definition display device can be provided. With one embodiment of the present invention, a large display device can be provided. With one embodiment of the present invention, a highly reliable display device can be provided.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIG. 3A to FIG. 3C are cross-sectional views illustrating an example of a method for manufacturing a display device.

FIG. 5A to FIG. 5C are cross-sectional views illustrating an example of the method for manufacturing a display device.

FIG. 6A to FIG. 6C are cross-sectional views illustrating an example of the method for manufacturing a display device.

FIG. 7A to FIG. 7C are cross-sectional views illustrating an example of the method for manufacturing a display device.

FIG. 10A and FIG. 10B are cross-sectional views illustrating an example of the method for manufacturing a display device.

FIG. 17A to FIG. 17D are diagrams each illustrating a structure example of a light-emitting device.

FIG. 18A and FIG. 18B are diagrams each illustrating an example of an electronic device.

FIG. 19A and FIG. 19B are diagrams each illustrating an example of an electronic device.

FIG. 21A to FIG. 21D are diagrams each illustrating an example of an electronic device.

FIG. 22A to FIG. 22F are diagrams each illustrating an example of an electronic device.

MODE FOR CARRYING OUT THE INVENTION

Figures 1A, 1B:
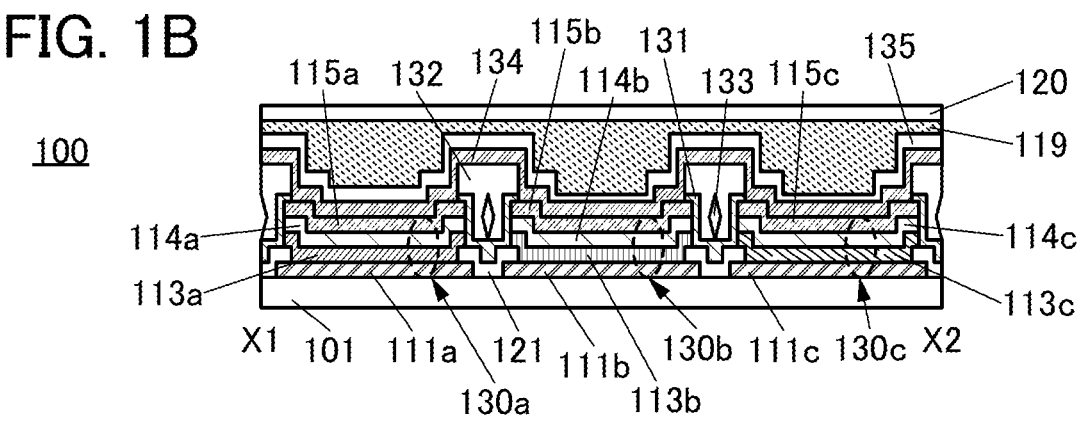
FIG. 1A is a top view illustrating an example of a display device.
FIG. 1B is a cross-sectional view illustrating an example of the display device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatching pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer"

can be replaced with the term "conductive film". As another example, the term "insulating film" can be replaced with the term "insulating layer".

In this specification and the like, a device formed using a metal mask or an FMM (a fine metal mask, a high-resolution metal mask) may be referred to as a device having an MM (metal mask) structure. In this specification and the like, a device formed without using a metal mask or an FMM may be referred to as a device having an MML (metal maskless) structure.

Embodiment 1

In this embodiment, a display device of one embodiment of the present invention and a manufacturing method thereof are described with reference to FIG. 1 to FIG. 10.

In a method for manufacturing a display device of one embodiment of the present invention, an island-shaped pixel electrode (also referred to as a lower electrode) is formed, a first layer (also referred to as an EL layer or part of an EL layer) including a light-emitting layer emitting light of a first color is formed over the entire surface, and then a first sacrificial layer is formed over the first layer. Then, a first resist mask is formed over the first sacrificial layer and the first layer and the first sacrificial layer are processed using the first resist mask, whereby the first layer is formed into an island shape. Next, in a manner similar to that for the first layer, a second layer (also referred to as an EL layer or part of an EL layer) including a light-emitting layer emitting light of a second color is processed into an island shape using a second sacrificial layer and a second resist mask.

As described above, in the method for manufacturing a display device of one embodiment of the present invention, the island-shaped EL layers are formed not by using a fine metal mask but by processing an EL layer deposited over the entire surface; thus, the island-shaped EL layers can be formed to have a uniform thickness. In addition, the sacrificial layers (also referred to as mask layers) provided over the EL layers can reduce damage to the EL layers in the manufacturing process of the display device, increasing the reliability of a light-emitting device.

Here, each of the first layer and the second layer includes at least a light-emitting layer and preferably consists of a plurality of layers. Specifically, one or more layers are preferably formed over the light-emitting layer. A layer between the light-emitting layer and the sacrificial layer can inhibit the light-emitting layer from being exposed on the outermost surface during the manufacturing process of the display device and can reduce damage to the light-emitting layer. Thus, the reliability of the light-emitting device can be increased.

Note that it is not necessary to form all layers included in EL layers separately between light-emitting devices emitting light of different colors, and some layers of the EL layers can be formed in the same step. In the method for manufacturing a display device of one embodiment of the present invention, after some layers included in the EL layers are formed into an island shape separately for each color, the sacrificial layer is removed and then other layers included in the EL layers and a counter electrode (also referred to as an upper electrode) are formed so as to be shared by the light-emitting devices of the respective colors. After that, a third resist mask is formed over the counter electrode, and with the use of the third resist mask, the EL layers and the counter electrode included in a region between two adjacent light-emitting devices are removed.

For example, in the case where a high-resolution or high-definition display device is manufactured, the distance between the light-emitting devices is extremely small (or the light-emitting devices are provided at short intervals) in many cases. Hence, layers included in adjacent light-emitting devices overlap with or touch each other in some cases. Thus, in the method for manufacturing a display device of one embodiment of the present invention, with the use of the third resist mask, the counter electrode and layers shared by the light-emitting devices of the respective colors (corresponding to the other layers included in the EL layers) are processed and a first layer and a second layer (each corresponding to some layers included in the EL layers), which are formed into an island shape in advance, are also further processed, so that the EL layers included in the two adjacent light-emitting devices can be inhibited from overlapping with or touching each other and the adjacent light-emitting devices can be electrically isolated. It is thus possible to inhibit a light-emitting device other than the desired light-emitting device from emitting light due to leakage of current to the adjacent light-emitting device (also referred to as crosstalk).

By the processing using the third resist mask, the counter electrode is divided into a plurality of island-shaped patterns for each light-emitting device. Thus, in the method for manufacturing a display device of one embodiment of the present invention, a conductive layer is provided to be electrically connected to the island-shaped counter electrode included in each light-emitting device. Specifically, a protective layer is formed over the counter electrode, a fourth resist mask is formed over the protective layer, and the protective layer is processed using the fourth resist mask to expose part of the counter electrode. In particular, the counter electrode is preferably exposed in a region overlapping with the pixel electrode. Then, the conductive layer is formed over the counter electrode and the protective layer. The conductive layer is provided to have a larger area than the counter electrode, and has a function of an auxiliary wiring. The conductive layer provided over the entire surface can electrically connect a plurality of counter electrodes. This can inhibit non-uniform potential distribution of the counter electrode, reduce luminance unevenness of the display device, and achieve high display quality. Note that in the case where the conductive layer is provided on a side through which light is extracted, the conductive layer is preferably formed using a material transmitting visible light.

[Structure Example of Display Device]

FIG. 1A and FIG. 1B illustrate a display device of one embodiment of the present invention.

FIG. 1A illustrates a top view of a display device 100. The display device 100 includes a display portion in which a plurality of pixels 110 are arranged in a matrix, and a connection portion 140 outside the display portion. Each of the pixels 110 consists of three subpixels 110a, 110b, and 110c. The connection portion 140 can also be referred to as a cathode contact portion.

The top surface shapes of the subpixels illustrated in FIG. 1A correspond to the top surface shapes of light-emitting regions.

The range of the circuit layout for forming the subpixels is not limited to the range of the subpixels illustrated in FIG. 1A and may be placed outside the subpixels. For example, transistors included in the subpixel 110a may be positioned within the range of the subpixel 110b illustrated in FIG. 1A, or some or all of the transistors may be positioned outside the range of the subpixel 110a.

Although the subpixels 110a, 110b, and 110c have the same or substantially the same aperture ratio (also referred to as size or size of a light-emitting region) in FIG. 1A, one embodiment of the present invention is not limited thereto. The aperture ratio of each of the subpixels 110a, 110b, and 110c can be determined as appropriate. The subpixels 110a, 110b, and 110c may have different aperture ratios, or two or more of the subpixels 110a, 110b, and 110c may have the same or substantially the same aperture ratio.

FIG. 1A illustrates an example in which subpixels of different colors are aligned in the X direction and subpixels of the same color are aligned in the Y direction. Note that subpixels of different colors may be aligned in the Y direction, and subpixels of the same color may be aligned in the X direction.

Although the top view of FIG. 1A illustrates an example in which the connection portion 140 is positioned in the lower side of the display portion, one embodiment of the present invention is not limited thereto. The connection portion 140 only needs to be provided in at least one of the upper side, the right side, the left side, and the lower side of the display portion in the top view, but may be provided so as to surround the four sides of the display portion.

FIG. 1B is a cross-sectional view taken along the dashed-dotted line X1-X2 in FIG. 1A.

As illustrated in FIG. 1B, in the display device 100, light-emitting devices 130a, 130b, and 130c are provided over a layer 101 including transistors and protective layers 131 and 132 are provided to cover side surfaces of these light-emitting devices. A conductive layer 134 is provided over the light-emitting devices 130a, 130b, and 130c and the protective layer 132. A protective layer 135 is provided over the conductive layer 134. A substrate 120 is bonded to the protective layer 135 with a resin layer 119.

The display device of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including transistors can employ a stacked-layer structure in which a plurality of transistors are provided over a substrate and an insulating layer is provided to cover these transistors, for example. Structure examples of the layer 101 including transistors will be described in Embodiment 2 and Embodiment 3.

The light-emitting devices 130a, 130b, and 130c emit light of different colors. Preferably, the light-emitting devices 130a, 130b, and 130c emit light of three colors, red (R), green (G), and blue (B), for example.

Each of the light-emitting devices includes an EL layer between a pair of electrodes. In this specification and the like, one of the pair of electrodes may be referred to as a pixel electrode and the other may be referred to as a counter electrode.

The light-emitting device 130a includes a pixel electrode 111a over the layer 101 including transistors, a first layer 113a over the pixel electrode 111a, a fourth layer 114a over the first layer 113a, and a counter electrode 115a over the fourth layer 114a. In the light-emitting device 130a, the first layer 113a and the fourth layer 114a can be collectively referred to as an EL layer.

The light-emitting device 130b includes a pixel electrode 111b over the layer 101 including transistors, a second layer 113b over the pixel electrode 111b, a fourth layer 114b over the second layer 113b, and a counter electrode 115b over the fourth layer 114b. The second layer 113b and the fourth layer 114b can be collectively referred to as an EL layer.

The light-emitting device 130c includes a pixel electrode 111c over the layer 101 including transistors, a third layer 113c over the pixel electrode 111c, a fourth layer 114c over the third layer 113c, and a counter electrode 115c over the fourth layer 114c. The third layer 113c and the fourth layer 114c can be collectively referred to as an EL layer.

The counter electrodes 115a, 115b, and 115c are electrically connected to the conductive layer 134. The counter electrodes 115a, 115b, and 115c are electrically connected to each other through the conductive layer 134. The conductive layer 134 is provided to have a larger area than the counter electrodes 115a, 115b, and 115c, and has a function of an auxiliary wiring.

The conductive layer 134 is electrically connected to a conductive layer provided in the connection portion 140. Accordingly, the counter electrodes included in the light-emitting devices of the respective colors are electrically connected to the conductive layer provided in the connection portion 140. Thus, the same potential is supplied to the counter electrodes included in the light-emitting devices of the respective colors.

The conductive layer 134 provided over the entire surface allows a plurality of counter electrodes to be electrically connected to each other. It is thus possible to inhibit non-uniform potential distribution of the counter electrodes, reduce luminance unevenness of the display device, and achieve high display quality. Note that in the case where the conductive layer 134 is provided on a side through which light is extracted, the conductive layer 134 is preferably formed using a material transmitting visible light.

A conductive film that transmits visible light is used as the electrode through which light is extracted among the pixel electrode and the counter electrode. A conductive film that reflects visible light is preferably used as the electrode through which light is not extracted.

As a material that forms the pair of electrodes (the pixel electrode and the counter electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

The light-emitting devices preferably employ a microcavity structure. Therefore, one of the pair of electrodes of the light-emitting devices is preferably an electrode having properties of transmitting and reflecting visible light (a semi-transmissive and semi-reflective electrode), and the other is preferably an electrode having a property of reflecting visible light (a reflective electrode). When the light-emitting devices have a microcavity structure, light obtained from the light-emitting layers can be resonated between the electrodes, whereby light emitted from the light-emitting devices can be intensified.

Note that the semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity lower than or equal to $1 \times 10^{-2}$ Ωcm.

The first layer 113a, the second layer 113b, and the third layer 113c each include a light-emitting layer. The first layer 113a, the second layer 113b, and the third layer 113c preferably include light-emitting layers that emit different colors.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. A substance that emits near-infrared light can also be used as the light-emitting substance.

Examples of the light-emitting substance include a fluorescent material, a phosphorescent material, a thermally activated delayed fluorescence (TADF) material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. As one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

In addition to the light-emitting layer, the first layer 113a, the second layer 113b, and the third layer 113c may further include layers containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used for the light-emitting device, and an inorganic compound may also be included. Each of the layers included in the light-emitting device can be formed by an evaporation method (including a vacuum evaporation method), a transfer method, a printing method, an ink-jet method, a coating method, or the like.

For example, the first layer 113a, the second layer 113b, and the third layer 113c may each include one or more of a hole-injection layer, a hole-transport layer, a hole-blocking layer, an electron-blocking layer, an electron-transport layer, and an electron-injection layer.

The fourth layers 114a, 114b, and 114c can each include one or more of a hole-injection layer, a hole-transport layer, a hole-blocking layer, an electron-blocking layer, an electron-transport layer, and an electron-injection layer. For example, in the case where the pixel electrodes 111a, 111b, and 111c function as anodes and the counter electrodes 115a, 115b, and 115c function as cathodes, each of the fourth layers 114a, 114b, and 114c preferably includes an electron-injection layer.

The hole-injection layer is a layer injecting holes from an anode to a hole-transport layer, and a layer containing a material with a high hole-injection property. Examples of the material with a high hole-injection property include an aromatic amine compound and a composite material containing a hole-transport material and an acceptor material (electron-accepting material).

The hole-transport layer is a layer transporting holes, which are injected from an anode by a hole-injection layer, to a light-emitting layer. The hole-transport layer is a layer containing a hole-transport material. As the hole-transport material, a substance having a hole mobility greater than or equal to $1 \times 10^{-6}$ cm²/Vs is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by an electron-injection layer, to a light-emitting layer. The electron-transport layer is a layer containing an electron-transport material. As the electron-transport material, a substance having an electron mobility greater than or equal to $1 \times 10^{-6}$ cm²/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a T-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, lithium fluoride (LiF), cesium fluoride (CsF), calcium fluoride (CaF₂), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate can be used.

Alternatively, an electron-transport material may be used as the electron-injection layer. For example, a compound having an unshared electron pair and having an electron deficient heteroaromatic ring can be used as the electron-transport material. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), or 2,4,6-tris[3'-(pyridin-3-yl)biphenyl-3-yl]-1,3,5-triazine (abbreviation: TmPPPyTz) can be used as the organic compound having an unshared electron pair. Note that NBPhen has a higher glass transition temperature (Tg) than BPhen and thus has high heat resistance.

The protective layers 131 and 132 are preferably provided over the light-emitting devices 130a, 130b, and 130c. Providing the protective layers 131 and 132 can improve the reliability of the light-emitting devices.

There is no limitation on the conductivity of the protective layers 131, 132, and 135. As the protective layers 131, 132, and 135, at least one type of insulating films, semiconductor films, and conductive films can be used.

The protective layers 131, 132, and 135 including inorganic films can inhibit deterioration of the light-emitting devices by preventing oxidation of the counter electrodes 115a, 115b, and 115c and inhibiting entry of impurities (e.g., moisture and oxygen) into the light-emitting devices 130a, 130b, and 130c, for example; thus, the reliability of the display device can be improved.

As the protective layers 131, 132, and 135, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Note that in this specification and the like, oxynitride refers to a material that contains more oxygen than nitrogen, and nitride oxide refers to a material that contains more nitrogen than oxygen.

Each of the protective layers 131, 132, and 135 preferably includes a nitride insulating film or a nitride oxide insulating film, and further preferably includes a nitride insulating film.

As the protective layers 131, 132, and 135, an inorganic film containing ITO, In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the counter electrodes 115a, 115b, and 115c. The inorganic film may further contain nitrogen.

When light emitted from the light-emitting device is extracted through the protective layers 131, 132, and 135, the protective layers 131, 132, and 135 preferably have a high visible-light-transmitting property. For example, ITO, IGZO, and aluminum oxide are preferable because they are inorganic materials having a high visible-light-transmitting property.

The protective layers 131, 132, and 135 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layer.

Furthermore, the protective layers 131, 132, and 135 may each include an organic film. For example, the protective layer 135 may include both an organic film and an inorganic film.

A space 133 exists between the protective layer 131 and the protective layer 132 or in the protective layer 132 in some cases. For example, the space 133 might be formed in the case where the protective layer 131 and the protective layer 132 are formed by different deposition methods. The space 133 might be formed when the protective layer 131 is formed with a deposition apparatus that allows a film to be formed at high coverage and the protective layer 132 is formed with a deposition apparatus that allows a film with lower coverage than the protective layer 131 to be formed. A specific example is as follows: the protective layer 131 is formed by an atomic layer deposition (ALD) method and the protective layer 132 is formed by a sputtering method.

The space 133 includes, for example, any one or more selected from air, nitrogen, oxygen, carbon dioxide, and Group 18 elements (typically, helium, neon, argon, xenon, and krypton). Furthermore, for example, a gas used during the deposition of the protective layer 132 is sometimes included in the space 133. For example, in the case where the protective layer 132 is deposited by a sputtering method, any one or more of the above-described Group 18 elements is sometimes included in the space 133. In the case where a gas is included in the space 133, a gas can be identified with a gas chromatography method or the like. Alternatively, in the case where the protective layer 132 is deposited by a sputtering method, a gas used in the sputtering is sometimes contained in the protective layer 132. In this case, an element such as argon is sometimes detected when the protective layer 132 is analyzed by an energy dispersive X-ray analysis (EDX analysis) or the like.

In the case where the refractive index of the space 133 is lower than that of the protective layer 131, light emitted from the first layer 113a, the second layer 113b, or the third layer 113c is reflected at the interface between the protective layer 131 and the space 133. Thus, light emitted from the first layer 113a, the second layer 113b, or the third layer 113c can be inhibited from entering an adjacent pixel (or subpixel). This can inhibit mixture of light of different colors, thereby improving the display quality of the display device.

End portions of the pixel electrodes 111a, 111b, and 111c are covered with an insulating layer 121.

In the display device of this embodiment, the light-emitting devices are provided with the island-shaped light-emitting layers of their respective colors, and the display device is manufactured by what is called a separate coloring method (SBS (Side By Side) method). Thus, the display device can have higher light extraction efficiency compared with a structure in which a white-light-emitting device and color filters are combined. Furthermore, since a light-emitting device with a single structure can be used, the driving voltage of the display device can be lower than that of a display device having a structure using a tandem light-emitting device. The SBS method also achieves a display device with lower power consumption than that using a structure in which a white-light-emitting device and color filters are combined or a structure using a tandem light-emitting device.

In the display device of this embodiment, the distance between the light-emitting devices can be narrowed. Specifically, the distance between the light-emitting devices can be less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display device of this embodiment includes a region where the distance between a side surface of the first layer 113a and a side surface of the second layer 113b or the distance between a side surface of the second layer 113b and a side surface of the third layer 113c is less than or equal to 1 μm, preferably less than or equal to 0.5 μm (500 nm), further preferably less than or equal to 100 nm.

[Manufacturing Method Example of Display Device]

Next, a manufacturing method example of a display device is described with reference to FIG. 2 to FIG. 10. FIG.

Figures 2A, 2B, 2C:
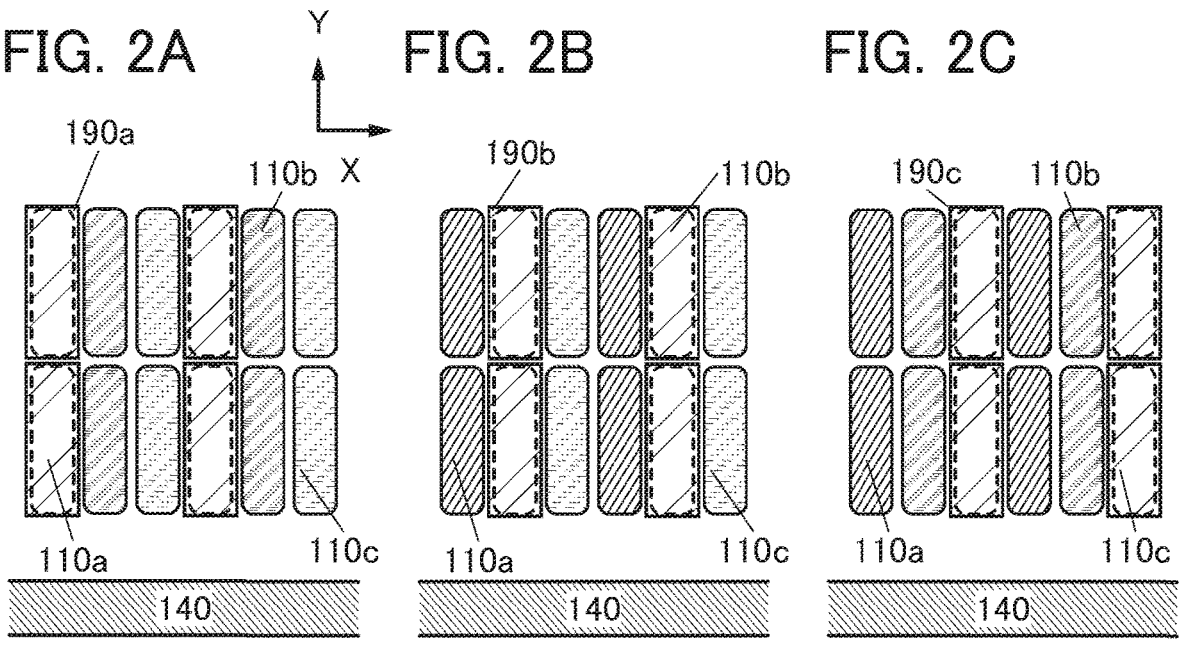
FIG. 2A to FIG. 2E are top views each illustrating an example of a display device.
Figures 2D, 2E:
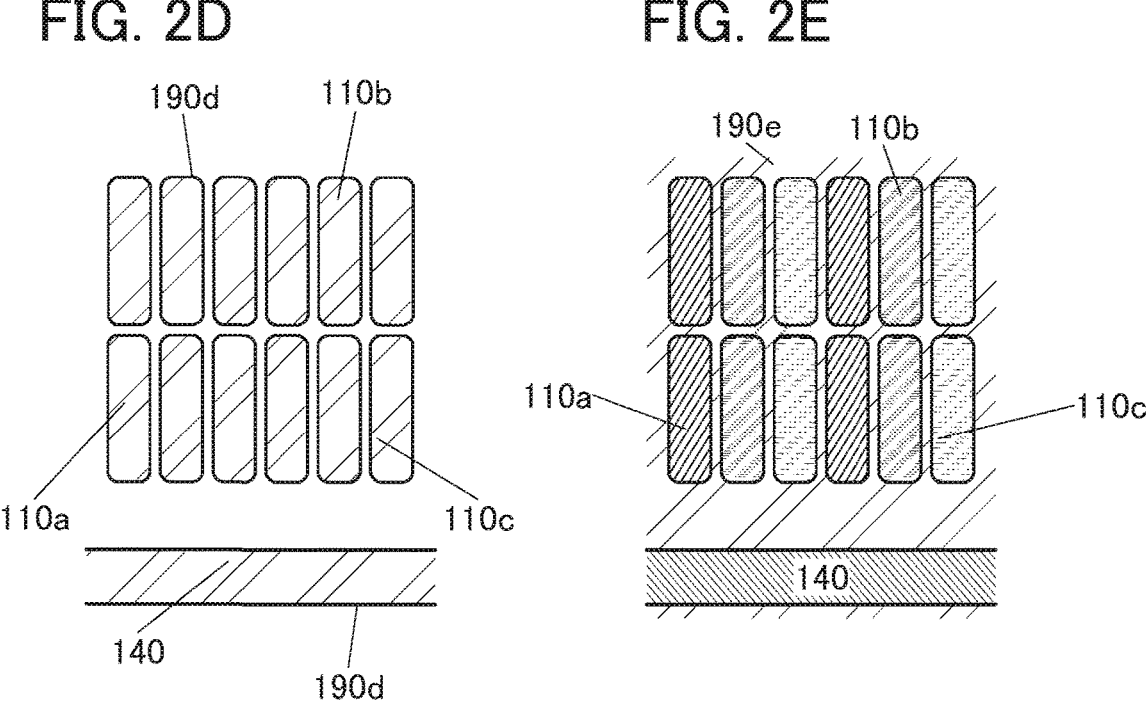

2A to FIG. 2E are top views illustrating the method for manufacturing a display device. FIG. 3A to FIG. 3C each illustrate a cross section along the dashed-dotted line X1-X2 and a cross section along the dashed-dotted line Y1-Y2 in FIG. 1A side by side. FIG. 4 to FIG. 10 are similar to FIG. 3.

Thin films that form the display device (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

The thin films that form the display device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

For manufacture of the light-emitting devices, a vacuum process such as an evaporation method or a solution process such as a spin coating method or an ink-jet method can be especially used. As the evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), and the like can be given. Specifically, the functional layers (e.g., the hole-injection layer, the hole-transport layer, the light-emitting layer, the electron-transport layer, and the electron-injection layer) included in the EL layers can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

When the thin films that form the display device are processed, a photolithography method or the like can be used. Alternatively, a nanoimprinting method, a sandblasting method, a lift-off method, or the like may be used for the processing of the thin films. Island-shaped thin films may be directly formed by a deposition method using a blocking mask such as a metal mask.

There are the following two typical examples of a photolithography method. In one of the methods, a resist mask is formed over a thin film that is to be processed, the thin film is processed by etching or the like, and the resist mask is removed. In the other method, after a photosensitive thin film is deposited, light exposure and development are performed, so that the thin film is processed into a desired shape.

As the light used for light exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Light exposure may be performed by liquid immersion light exposure technique. As the light used for the light exposure, extreme ultraviolet (EUV) light or X-rays may be used. Furthermore, instead of the light used for the light exposure, an electron beam can also be used. It is preferable to use extreme ultraviolet light, X-rays, or an electron beam because extremely minute processing can be performed. Note that in the case of performing light exposure by scanning of a beam such as an electron beam, a photomask is not needed.

For etching of the thin film, a dry etching method, a wet etching method, a sandblasting method, or the like can be used.

First, as illustrated in FIG. 3A, the pixel electrodes 111a, 111b, and 111c and a conductive layer 123 are formed over the layer 101 including transistors. The pixel electrodes are provided in the display portion, and the conductive layer 123 is provided in the connection portion 140.

Next, the insulating layer 121 that covers the end portions of the pixel electrodes 111a, 111b, and 111c and an end portion of the conductive layer 123 is formed.

Then, a first layer 113A is formed over the pixel electrodes 111a, 111b, and 111c and the insulating layer 121, and a first sacrificial layer 118A is formed over the first layer 113A, the insulating layer 121, and the conductive layer 123. FIG. 3A illustrates, but the present invention is not limited to, an example in which an end portion of the first layer 113A that is closer to the connection portion 140 is positioned inside an end portion of the first sacrificial layer 118A in the cross-sectional view along the line Y1-Y2. The end portion of the first layer 113A may be aligned with the end portion of the first sacrificial layer 118A, and the first layer 113A may be provided over the conductive layer 123. Note that for example, by using a mask for specifying a deposition area (also referred to as an area mask or a rough metal mask to be distinguished from a fine metal mask), the first sacrificial layer 118A and the first layer 113A can be deposited in different regions. In one embodiment of the present invention, the light-emitting devices are formed using a resist mask; by using a combination of a resist mask and an area mask as described above, the light-emitting devices can be formed in a relatively simple process.

Materials that can be used for the pixel electrodes are as described above. For formation of the pixel electrodes, a sputtering method or a vacuum evaporation method can be used, for example.

The insulating layer 121 can have a single-layer structure or a stacked-layer structure including one or both of an inorganic insulating film and an organic insulating film.

Examples of an organic insulating material that can be used for the insulating layer 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer 121, an inorganic insulating film that can be used as the protective layers 131, 132, and 135 can be used.

When an inorganic insulating film is used as the insulating layer 121 that covers the end portions of the pixel electrodes, impurities are less likely to enter the light-emitting devices as compared with the case where an organic insulating film is used; therefore, the reliability of the light-emitting devices can be improved. When an organic insulating film is used as the insulating layer 121 that covers the end portions of the pixel electrodes, high step coverage can be obtained as compared with the case where an inorganic insulating film is used; therefore, an influence of the shape of the pixel electrodes can be small. As a result, a short circuit in the light-emitting devices can be prevented. Specifically, when an organic insulating film is used as the insulating layer 121, the insulating layer 121 can be processed into a tapered shape or the like. Note that in this specification and the like, a tapered shape refers to a shape in which at least part of a side surface of a structure is inclined to a substrate surface or a formation surface. For example, a tapered shape preferably includes a region where the angle between the inclined side surface and the substrate surface (such an angle is also referred to as a taper angle) is less than 90°.

Note that the insulating layer 121 is not necessarily provided. The aperture ratio of a subpixel can be sometimes increased when the insulating layer 121 is not provided. Alternatively, the distance between subpixels can be shortened and the resolution or the definition of the display device can be increased in some cases.

The first layer 113A is a layer to be the first layer 113a later. Therefore, the first layer 113A can employ the above-described structure that can be used for the first layer 113a. The layers included in the first layer 113A can each be formed by a method such as an evaporation method (including a vacuum evaporation method), a transfer method, a printing method, an ink-jet method, or a coating method. The layers included in the first layer 113A may be formed using a premix material.

As the first sacrificial layer 118A, a film that is highly resistant to the process conditions for the first layer 113A, and a second layer 113B, a third layer 113C, and the like formed in later steps, specifically, a film that has high etching selectivity with these layers, is used. The first sacrificial layer 118A may have a single-layer structure or a stacked-layer structure.

The first sacrificial layer 118A can be formed by a sputtering method, an ALD method (including a thermal ALD method and a PEALD method), or a vacuum evaporation method, for example. Note that a formation method that gives less damage to an EL layer is preferred, and an ALD method or a vacuum evaporation method is more suitable for the formation of the first sacrificial layer 118A than a sputtering method.

As the first sacrificial layer 118A, a film that can be removed by a wet etching method is preferably used. The use of a wet etching method can reduce damage to the first layer 113A in processing of the first sacrificial layer 118A, as compared with the case of using a dry etching method.

In the method for manufacturing a display device of this embodiment, it is desirable that the layers (e.g., the first layer to the fourth layer) included in the EL layer not be easily processed in the steps of processing the sacrificial layers, and that the sacrificial layers not be easily processed in the steps of processing the layers included in the EL layer. These are preferably taken into consideration to select the materials and a processing method for the sacrificial layers and processing methods for the EL layer.

The first sacrificial layer 118A can be formed using an inorganic film such as a metal film, an alloy film, a metal oxide film, a semiconductor film, or an inorganic insulating film, for example.

For the first sacrificial layer 118A, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used.

For the first sacrificial layer 118A, a metal oxide such as In—Ga—Zn oxide can be used. As the first sacrificial layer 118A, an In—Ga—Zn oxide film can be formed by a sputtering method, for example. It is also possible to use indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon, or the like can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium.

As the first sacrificial layer 118A, a variety of inorganic insulating films that can be used as the protective layers 131, 132, and 135 can be used. In particular, an oxide insulating film is preferable because having higher adhesion to the first layer 113A than a nitride insulating film. For example, an inorganic insulating material such as aluminum oxide, hafnium oxide, or silicon oxide can be used for the first sacrificial layer 118A. As the first sacrificial layer 118A, for example, an aluminum oxide film can be formed by an ALD method. The ALD method is preferably used because damage to a base layer (particularly the EL layer or the like) can be reduced.

For example, the first sacrificial layer 118A can employ a stacked-layer structure of an In—Ga—Zn oxide film formed by a sputtering method and an aluminum oxide film formed over the In—Ga—Zn oxide film by an ALD method. As another example, the first sacrificial layer 118A can employ a stacked-layer structure of an aluminum oxide film formed by an ALD method and an In—Ga—Zn oxide film formed over the aluminum oxide film by a sputtering method. Alternatively, the first sacrificial layer 118A can employ a single-layer structure of an aluminum oxide film formed by an ALD method.

Next, a resist mask 190a is formed over the first sacrificial layer 118A as illustrated in FIG. 3B. The resist mask can be formed by application of a photosensitive resin (photoresist), exposure, and development. The resist mask 190a is provided at a position overlapping with the pixel electrode 111a. The resist mask 190a preferably does not overlap with the pixel electrodes 111b and 111c. In the case where the resist mask 190a overlaps with the pixel electrodes 111b and 111c, the insulating layer 121 is preferably positioned therebetween. Furthermore, the resist mask 190a is preferably provided also at a position overlapping with the conductive layer 123. This can inhibit damage to the conductive layer 123 during the manufacturing process of the display device.

As illustrated in FIG. 2A, one island-shaped pattern is preferably provided for one subpixel 110a as the resist mask 190a. Alternatively, one band-like pattern for a plurality of subpixels 110a aligned in one column (aligned in the Y direction in FIG. 2A) may be formed as the resist mask 190a.

Then, as illustrated in FIG. 3C, part of the first layer 113A and part of the first sacrificial layer 118A are removed using the resist mask 190a. As a result, regions of the first layer 113A and the first sacrificial layer 118A, which do not overlap with the resist mask 190a, can be removed. Thus, the pixel electrodes 111b and 111c and the conductive layer 123 are exposed. A stacked-layer structure of the first layer 113a, the first sacrificial layer 118a, and the resist mask 190a remains over the pixel electrode 111a. After that, the resist mask 190a is removed.

The first sacrificial layer 118A can be processed by a wet etching method or a dry etching method. The first sacrificial layer 118A is preferably processed by anisotropic etching.

The use of a wet etching method can reduce damage to the first layer 113A in processing of the first sacrificial layer 118A, as compared with the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution thereof, or the like, for example.

In the case of using a dry etching method, deterioration of the first layer 113A can be inhibited by not using a gas containing oxygen as the etching gas. In the case of using a dry etching method, it is preferable to use a gas containing $CF_+$, $C_+F_8$, $SF_6$, $CHF_3$, $Cl_2$, $H_2O$, $BCl_3$, or a noble gas (also referred to as rare gas) such as He as the etching gas, for example.

Note that FIG. 3C illustrates, but the present invention is not limited to, an example in which the first sacrificial layer 118A and the first layer 113A are processed in a state where the resist mask 190a is left. For example, in the case where the first sacrificial layer 118A has a stacked-layer structure, some of the first sacrificial layer 118A may be processed using the resist mask 190a, and the other layers may be processed with the processed layers used as a hard mask after the resist mask 190a is removed.

For example, some of the first sacrificial layer 118A are processed using the resist mask 190a; then, the resist mask 190a is removed by ashing or the like using oxygen plasma. At this time, the other layers of the first sacrificial layer 118A are positioned on the outermost surface and the first layer 113A is not exposed; thus, the first layer 113A can be inhibited from being damaged in the step of removing the resist mask 190a. Then, with the processed layers of the first sacrificial layer 118A used as a hard mask, the other layers of the first sacrificial layer 118A and the first layer 113A can be processed.

The first layer 113A is preferably processed by anisotropic etching. Anisotropic dry etching is particularly preferable. As an etching gas, a gas containing nitrogen, a gas containing hydrogen, a gas containing a noble gas, a gas containing nitrogen and argon, a gas containing nitrogen and hydrogen, or the like is preferably used. Deterioration of the first layer 113A can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the first layer 113A can be inhibited. Furthermore, a defect such as attachment of a reaction product generated at the etching can be inhibited.

Figures 4A, 4B, 4C:
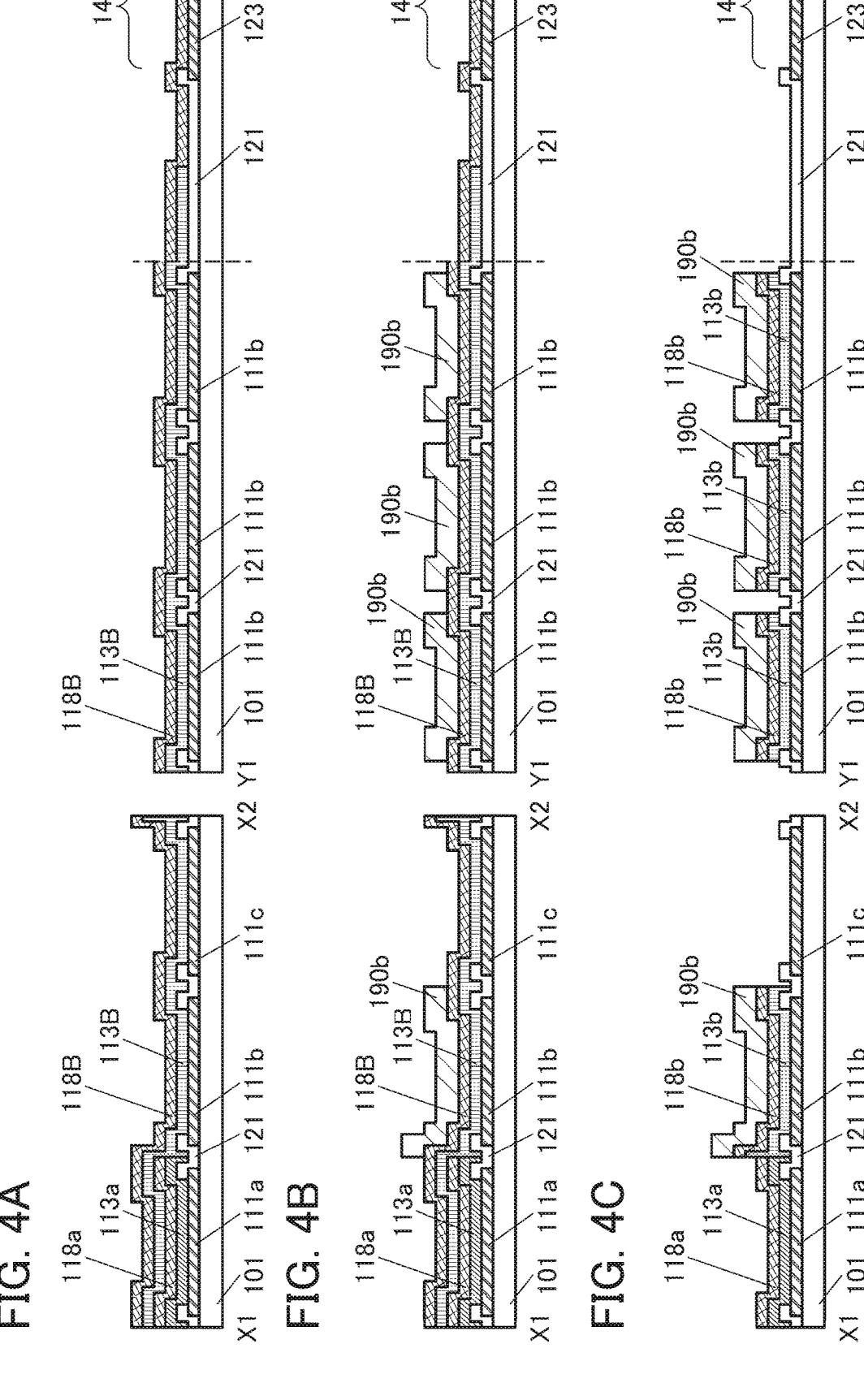
FIG. 4A to FIG. 4C are cross-sectional views illustrating an example of the method for manufacturing a display device.

Next, as illustrated in FIG. 4A, the second layer 113B is formed over the first sacrificial layer 118a, the pixel electrodes 111b and 111c, and the insulating layer 121, and a second sacrificial layer 118B is formed over the second layer 113B, the insulating layer 121, and the conductive layer 123. FIG. 4A illustrates, but the present invention is not limited to, an example in which an end portion of the second layer 113B that is closer to the connection portion 140 is positioned inside an end portion of the second sacrificial layer 118B in the cross-sectional view along the line Y1-Y2. The end portion of the second layer 113B may be aligned with the end portion of the second sacrificial layer 118B, and the second layer 113B may be provided over the conductive layer 123.

The second layer 113B is a layer to be the second layer 113b later. The second layer 113b emits light of a color different from that of light emitted by the first layer 113a. Structures, materials, and the like that can be used for the second layer 113b are similar to those for the first layer 113a.

The second layer 113B can be deposited by a method similar to that for the first layer 113A.

The second sacrificial layer 118B can be formed using a material that can be used for the first sacrificial layer 118A.

Next, a resist mask 190b is formed over the second sacrificial layer 118B as illustrated in FIG. 4B. The resist mask 190b is provided at a position overlapping with the pixel electrode 111b. The resist mask 190b may overlap with the first layer 113a over the insulating layer 121. In that case, an end portion of the first layer 113a overlaps with an end portion of the second layer 113b formed by using the resist mask 190b. However, the manufacturing method of the display device in this embodiment includes the step of further processing the first layer 113a and the second layer 113b (processing step using a resist mask 190d described later). It is thus possible to inhibit the first layer 113a and the second layer 113b from overlapping with or touching each other and can electrically isolate adjacent light-emitting devices emitting light of different colors. Note that the resist mask 190b preferably does not overlap with the first layer 113a, the pixel electrodes 111a and 111c, and the conductive layer 123 when the insulating layer 121 is not interposed therebetween. In the case where the resist mask 190b overlaps with the pixel electrodes 111a and 111c or the conductive layer 123, the insulating layer 121 is preferably positioned therebetween.

As illustrated in FIG. 2B and FIG. 4B, one island-shaped pattern is preferably provided for one subpixel 110b as the resist mask 190b. Alternatively, one band-like pattern for a plurality of subpixels 110b aligned in one column may be formed as the resist mask 190b.

Then, as illustrated in FIG. 4C, part of the second layer 113B and part of the second sacrificial layer 118B are removed using the resist mask 190b. As a result, regions of the second layer 113B and the second sacrificial layer 118B, which do not overlap with the resist mask 190b, can be removed. Thus, the first sacrificial layer 118a, the pixel electrode 111c, and the conductive layer 123 are exposed. A stacked-layer structure of the second layer 113b, the second sacrificial layer 118b, and the resist mask 190b remains over the pixel electrode 111b. After that, the resist mask 190b is removed.

The second sacrificial layer 118B can be processed by a method that can be used for processing of the first sacrificial layer 118A. The second layer 113B can be processed by a method that can be used for processing of the first layer 113A. The resist mask 190b can be removed by a method and at a timing that can be used for removing of the resist mask 190a.

Figures 5A, 5B, 5C:
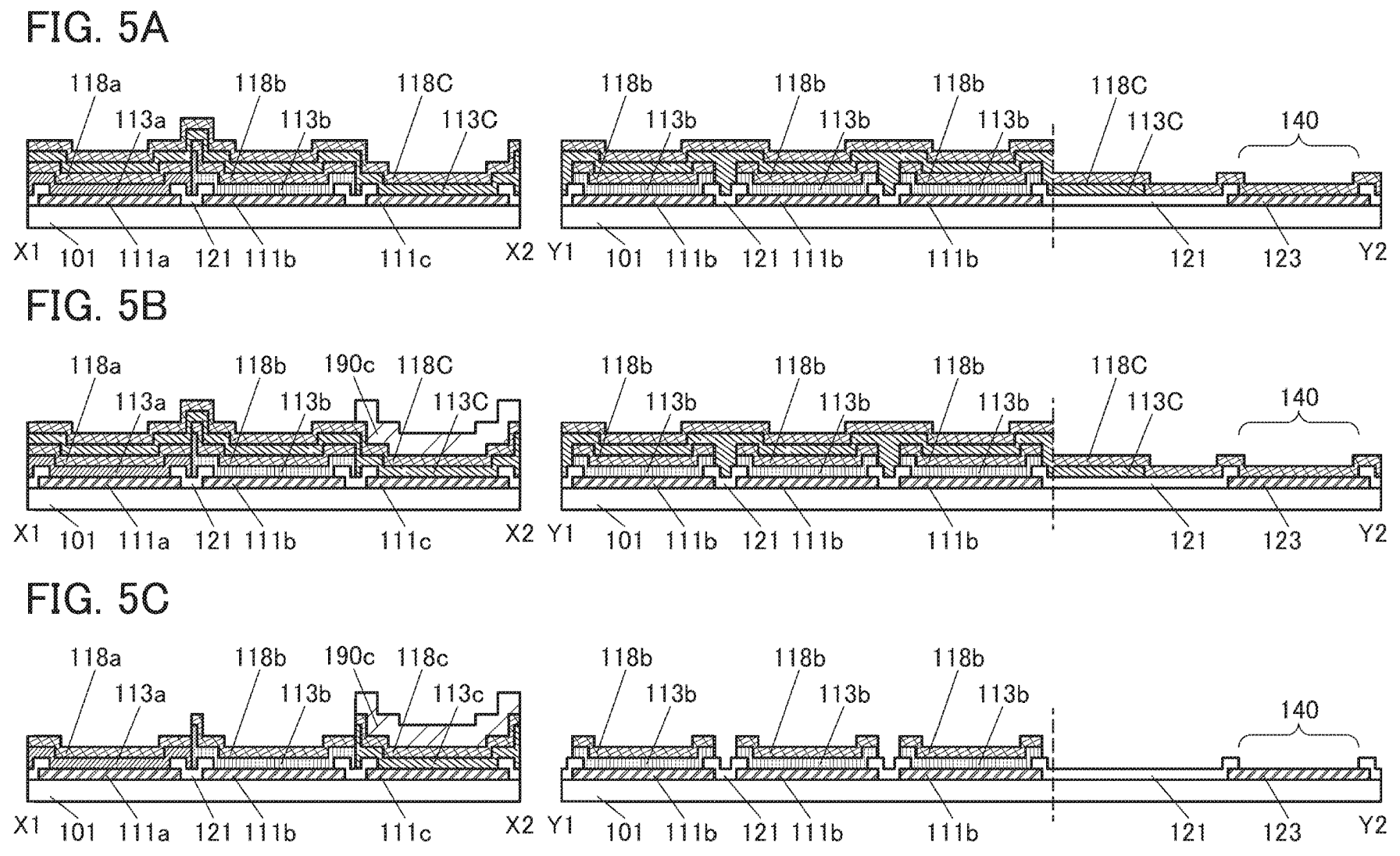

Next, as illustrated in FIG. 5A, a third layer 113C is formed over the first sacrificial layer 118a, the second sacrificial layer 118b, the pixel electrode 111c, and the insulating layer 121, and a third sacrificial layer 118C is formed over the third layer 113C, the insulating layer 121, and the conductive layer 123. FIG. 5A illustrates, but the present invention is not limited to, an example in which an end portion of the third layer 113C that is closer to the connection portion 140 is positioned inside an end portion of the third sacrificial layer 118C in the cross-sectional view along the line Y1-Y2. The end portion of the third layer 113C may be aligned with the end portion of the third sacrificial layer 118C, and the third layer 113C may be provided over the conductive layer 123.

The third layer 113C is a layer to be the third layer 113c later. The third layer 113c emits light of a color different from that of light emitted by the first layer 113a and the second layer 113b. Structures, materials, and the like that can be used for the third layer 113c are similar to those for the first layer 113a. The third layer 113C can be deposited by a method similar to that for the first layer 113A.

The third sacrificial layer 118C can be formed using a material that can be used for the first sacrificial layer 118A.

Next, a resist mask 190c is formed over the third sacrificial layer 118C as illustrated in FIG. 5B. The resist mask 190c is provided at a position overlapping with the pixel electrode 111c. The resist mask 190c may overlap with at least one of the first layer 113a and the second layer 113b over the insulating layer 121. In that case, the end portion of the first layer 113a or the end portion of the second layer 113b overlaps with an end portion of the third layer 113c formed by using the resist mask 190c. However, the manufacturing method of the display device in this embodiment includes the step of further processing the first layer 113a, the second layer 113b, and the third layer 113c (processing step using the resist mask 190d described later). It is thus possible to inhibit the first layer 113a or the second layer 113b from overlapping with or touching the third layer 113c and can electrically isolate adjacent light-emitting devices emitting light of different colors. Note that the resist mask 190c preferably does not overlap with the first layer 113a, the second layer 113b, the pixel electrodes 111a and 111b, and the conductive layer 123 when the insulating layer 121 is not interposed therebetween. In the case where the resist mask 190c overlaps with the pixel electrodes 111a and 111b or the conductive layer 123, the insulating layer 121 is preferably positioned therebetween.

As illustrated in FIG. 2C, one island-shaped pattern is preferably provided for one subpixel 110c as the resist mask 190c. Alternatively, one band-like pattern for a plurality of subpixels 110c aligned in one column may be formed as the resist mask 190c.

Then, as illustrated in FIG. 5C, part of the third layer 113C and part of the third sacrificial layer 118C are removed using the resist mask 190c. As a result, regions of the third layer 113C and the third sacrificial layer 118C, which do not overlap with the resist mask 190c, can be removed. Thus, the first sacrificial layer 118a, the second sacrificial layer 118b, and the conductive layer 123 are exposed. A stacked-layer structure of the third layer 113c, the third sacrificial layer 118c, and the resist mask 190c remains over the pixel electrode 111c. After that, the resist mask 190c is removed.

The third sacrificial layer 118C can be processed by a method that can be used for processing of the first sacrificial layer 118A. The third layer 113C can be processed by a method that can be used for processing of the first layer 113A. The resist mask 190c can be removed by a method and at a timing that can be used for removing of the resist mask 190a.

Figures 6A, 6B, 6C:
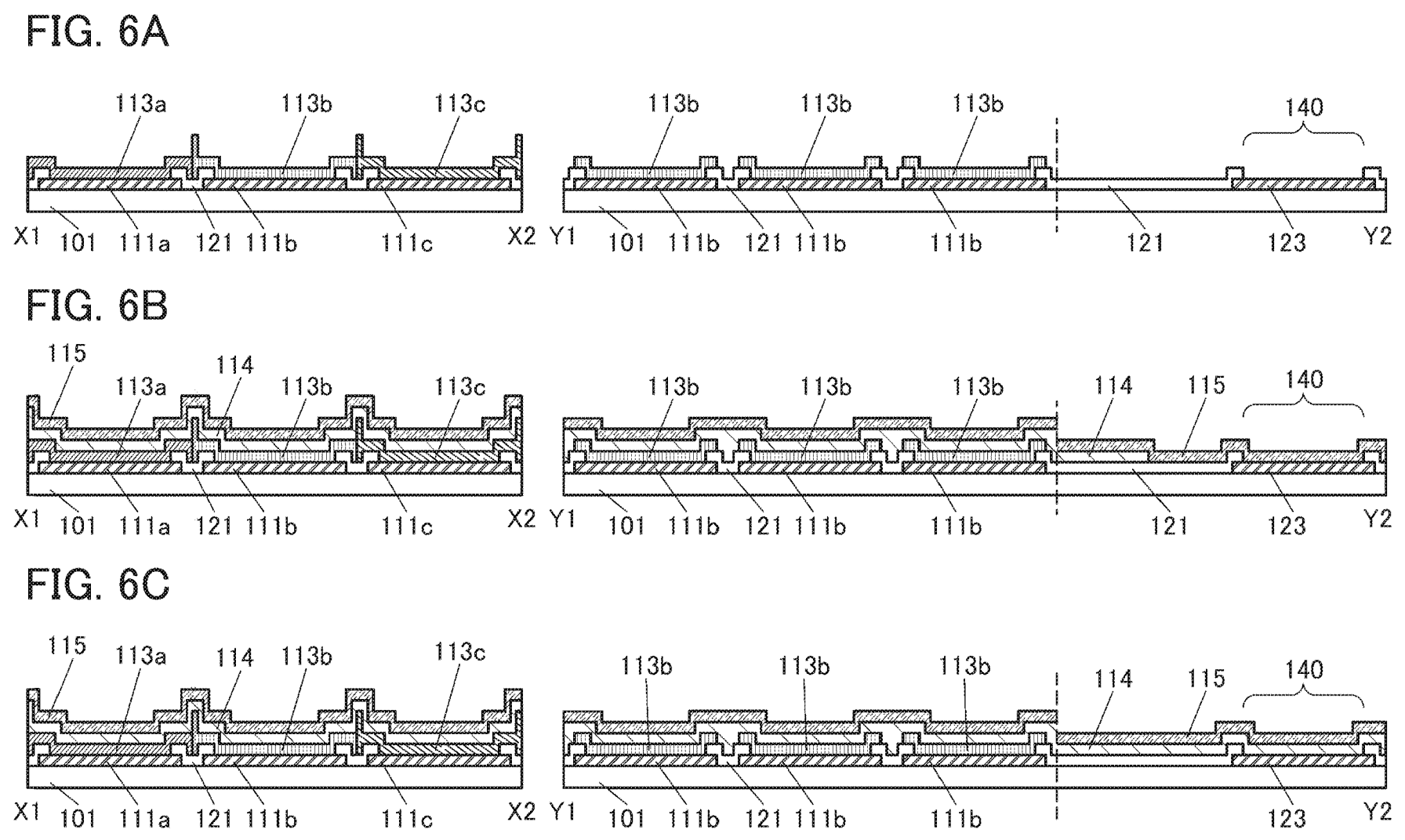

Then, as illustrated in FIG. 6A, the first sacrificial layer 118a, the second sacrificial layer 118b, and the third sacrificial layer 118c are removed. As a result, the first layer 113a over the pixel electrode 111a, the second layer 113b over the pixel electrode 111b, the third layer 113c over the pixel electrode 111c, and the conductive layer 123 are exposed.

The step of removing the sacrificial layers can be performed by a method similar to that for the step of processing the sacrificial layers. In particular, the use of a wet etching method can reduce damage to the first layer 113a, the second layer 113b, and the third layer 113c at the time of removing the first sacrificial layer 118a, the second sacrificial layer 118b, and the third sacrificial layer 118c, as compared to the case of using a dry etching method.

Then, as illustrated in FIG. 6B, the fourth layer 114 is formed to cover the first layer 113a, the second layer 113b, the third layer 113c, and the insulating layer 121, and a counter electrode 115 is formed over the fourth layer 114, the insulating layer 121, and the conductive layer 123.

FIG. 6B illustrates, but the present invention is not limited to, an example in which an end portion of the fourth layer 114 that is closer to the connection portion 140 is positioned inside an end portion of the counter electrode 115 in the cross-sectional view along the line Y1-Y2. The end portion of the fourth layer 114 may be aligned with the end portion of the counter electrode 115, and the fourth layer 114 may be provided over the conductive layer 123 as illustrated in FIG. 6C.

The fourth layer 114 is a layer to be the fourth layers 114a, 114b, and 114c later. Therefore, the fourth layer 114 can employ the above-described structure that can be used for the fourth layers 114a, 114b, and 114c. The layers included in the fourth layer 114 can each be formed by a method such as an evaporation method (including a vacuum evaporation method), a transfer method, a printing method, an ink-jet method, or a coating method. The layers included in the fourth layer 114 may be formed using a premix material.

Materials that can be used for the counter electrode 115 are as described above. For formation of the counter electrode 115, a sputtering method or a vacuum evaporation method can be used, for example.

Next, the resist mask 190d is formed over the counter electrode 115 as illustrated in FIG. 7A.

The resist mask 190d is provided at least at a position overlapping with the pixel electrodes 111a, 111b, and 111c. The resist mask 190d is preferably not provided in a region between the pixel electrode 111a and the pixel electrode 111b, a region between the pixel electrode 111b and the pixel electrode 111c, and a region between the pixel electrode 111a and the pixel electrode 111c in a top view.

FIG. 7A shows an example of a step following FIG. 6B. In FIG. 7A, the resist mask 190d is provided at a position overlapping with the conductive layer 123.

As illustrated in FIG. 2D, one island-shaped pattern is preferably provided for one subpixel as the resist mask 190d. It can be said that a top surface shape of the resist mask 190d corresponds to a top surface shape of a light-emitting region of a subpixel. It can also be said that as illustrated in FIG. 2D, a top surface shape of the resist mask 190d corresponds to a top surface shape of a counter electrode provided in the connection portion 140.

Next, as illustrated in FIG. 7B, part of the fourth layer 114 and part of the counter electrode 115 are removed using the resist mask 190d. This can remove the fourth layer 114 and the counter electrode 115 that are included in a region between two light-emitting devices. A stacked-layer structure of the first layer 113a, the fourth layer 114a, the counter electrode 115a, and the resist mask 190d remains over the pixel electrode 111a. Similarly, a stacked-layer structure of the second layer 113b, the fourth layer 114b, the counter electrode 115b, and the resist mask 190d remains over the pixel electrode 111b; and a stacked-layer structure of the third layer 113c, the fourth layer 114c, the counter electrode 115c, and the resist mask 190d remains over the pixel electrode 111c. A conductive layer 115d also remains over the conductive layer 123. A top surface shape of the conductive layer 115d corresponds to a top surface shape of the resist mask 190d provided in the connection portion 140 illustrated in FIG. 2D.

The counter electrode 115 can be processed by a wet etching method or a dry etching method. The counter electrode 115 is preferably processed by anisotropic etching.

The fourth layer 114 can be processed by a method that can be used for processing of the first layer 113A.

In the processing step using the resist mask 190d, part of the first layer 113a, part of the second layer 113b, and part of the third layer 113c, which are positioned over the insulating layer 121, are also removed in some cases. For example, in the case where two of the first layer 113a, the second layer 113b, and the third layer 113c have a part overlapping with or touching each other over the insulating layer 121, removing the part can electrically isolate light-emitting devices emitting light of different colors. Accordingly, crosstalk can be inhibited.

Figures 8A, 8B:
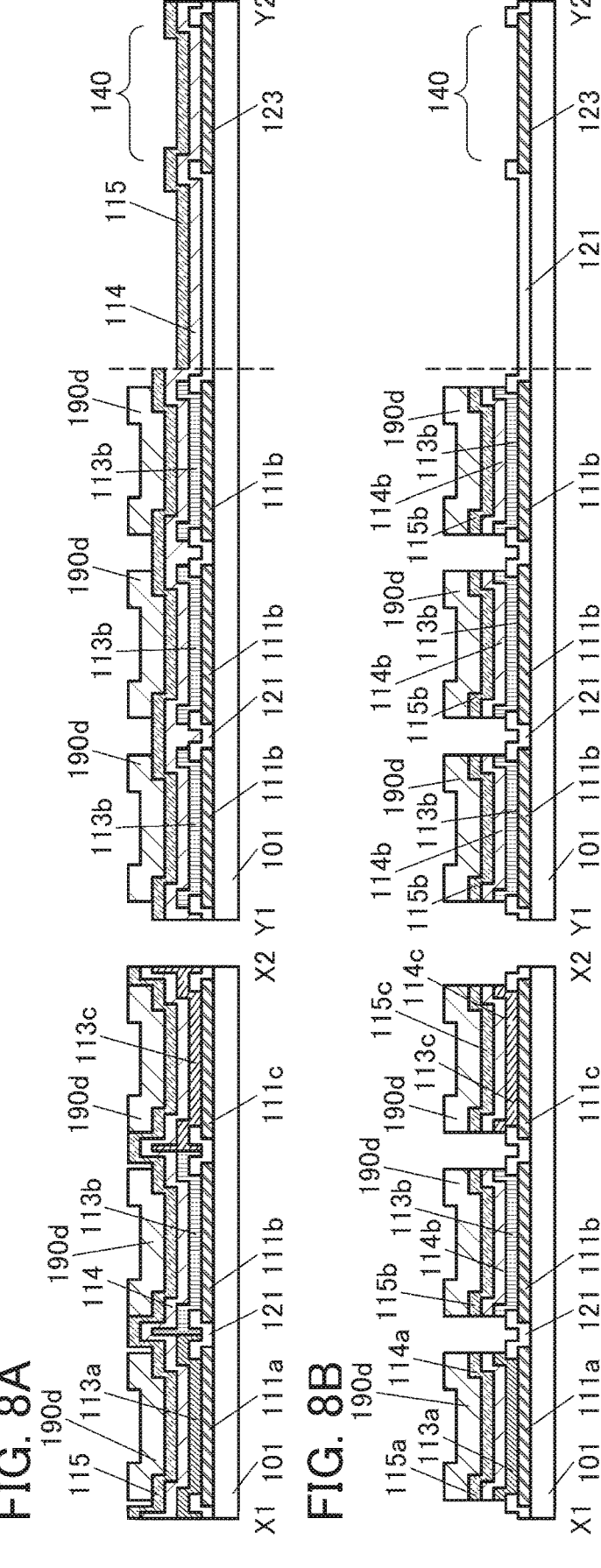
FIG. 8A and FIG. 8B are cross-sectional views illustrating an example of the method for manufacturing a display device.

Here, steps of FIG. 8A and FIG. 8B are described as steps following FIG. 6C.

The resist mask 190d is not necessarily provided at a position overlapping with the conductive layer 123. In FIG. 8A, the resist mask 190d is not provided at a position overlapping with the conductive layer 123.

Next, as illustrated in FIG. 8B, part of the fourth layer 114 and part of the counter electrode 115 are removed using the resist mask 190d. The structure illustrated in FIG. 8B is different from that illustrated in FIG. 7B in that the counter electrode does not remain over the conductive layer 123. The conductive layer 123 is exposed in FIG. 8B. As shown here, the counter electrode is not necessarily provided in the connection portion 140. Note that steps of FIG. 7A and FIG. 7B may be sometimes performed as steps following FIG. 6C. That is, the fourth layer 114 and the conductive layer 115d may remain in the connection portion 140 in some cases. For example, the fourth layer 114 does not affect the electrical connection of the conductive layer 123, the conductive layer 115d, and the conductive layer 134 in some cases for the following reasons: the thickness of the fourth layer 114 is extremely thin, the conductivity of the fourth layer 114 is high, the area of the connection portion 140 is large, and the like. In such a case, the fourth layer 114 may remain over the conductive layer 123.

Note that the steps performed after the steps illustrated in FIG. 6B, FIG. 7A, and FIG. 7B are sequentially performed are similar to the steps performed after the steps illustrated in FIG. 6C, FIG. 8A, and FIG. 8B are sequentially performed. Hereinafter, the steps following FIG. 7B are described as an example with reference to drawings.

Next, the resist mask 190d is removed as illustrated in FIG. 7C. Note that the resist mask 190d may be removed after the counter electrode 115 is processed. In that case, the fourth layer 114 can be processed with the counter electrodes 115a, 115b, and 115c used as a hard mask.

Figures 9A, 9B, 9C:
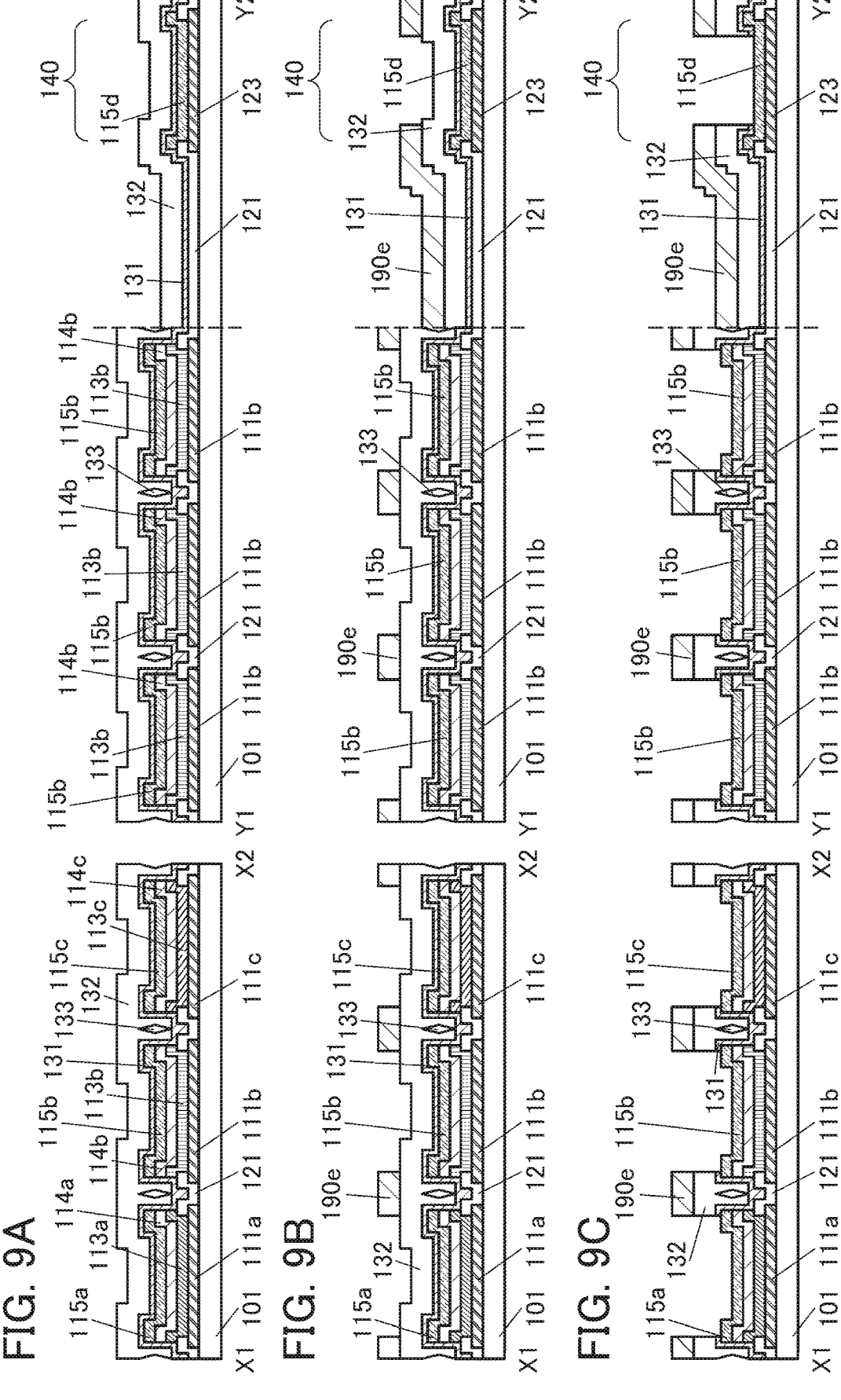
FIG. 9A to FIG. 9C are cross-sectional views illustrating an example of the method for manufacturing a display device.

Then, as illustrated in FIG. 9A, the protective layer 131 is formed over the counter electrodes 115a, 115b, and 115c, the conductive layer 115d, and the insulating layer 121, and the protective layer 132 is formed over the protective layer 131.

Materials that can be used for the protective layers 131 and 132 are as described above. Examples of the deposition method of the protective layers 131 and 132 include a vacuum evaporation method, a sputtering method, a CVD method, and an ALD method. The protective layer 131 and the protective layer 132 may be films formed by different deposition methods. The protective layers 131 and 132 may each have a single-layer structure or a stacked-layer structure.

Although the space 133 is formed by deposition of the protective layers 131 and 132 in the example shown here, the space 133 is not necessarily formed. In the latter case, a region between adjacent light-emitting devices is filled with the protective layer 132. FIG. 9A and the like illustrate a space surrounded by the protective layer 132; a space might be formed so as to be surrounded by the protective layer 131 and the protective layer 132, surrounded by the insulating layer 121 and the protective layer 131, surrounded by the insulating layer 121 and the protective layer 132, or surrounded by the insulating layer 121, the protective layer 131, and the protective layer 132. FIG. 9A illustrates, but the present invention is not limited to, an example in which a recessed portion of the insulating layer 121 is filled with the protective layer 131. Hence, a space exists in the recessed portion of the insulating layer 121 in some cases.

Next, a resist mask 190e is formed over the protective layer 132 as illustrated in FIG. 9B.

The resist mask 190e is provided at a position overlapping with at least the insulating layer 121. The resist mask 190e includes an opening in a region overlapping with each of the pixel electrodes 111a, 111b, and 111c and the conductive layer 123.

As illustrated in FIG. 2E, the resist mask 190e preferably includes an opening overlapping with the subpixel 110a, an opening overlapping with the subpixel 110b, an opening overlapping with the subpixel 110c, and an opening overlapping with the connection portion 140.

Then, as illustrated in FIG. 9C, part of the protective layer 131 and part of the protective layer 132 are removed using the resist mask 190e. As a result, regions of the protective layers 131 and 132, which do not overlap with the resist mask 190e, can be removed. Thus, the counter electrodes 115a, 115b, and 115c and the conductive layer 115d are exposed.

Next, the resist mask 190e is removed as illustrated in FIG. 10A. Note that the resist mask 190e may be removed after the protective layer 132 is processed. In that case, the protective layer 131 can be processed with the protective layer 132 used as a hard mask.

Then, as illustrated in FIG. 10B, the conductive layer 134 is formed over the counter electrodes 115a, 115b, and 115c, the conductive layer 115d, and the protective layer 132.

The conductive layer 134 is provided to have a larger area than the counter electrode, and has a function of an auxiliary wiring. The conductive layer 134 provided over the entire surface can electrically connect the counter electrodes 115a, 115b, and 115c and the conductive layer 115d. In the connection portion 140, the conductive layer 123, the conductive layer 115d, and the conductive layer 134 are electrically connected to each other. Thus, the same potential is supplied to the counter electrodes included in the light-emitting devices of the respective colors. This can inhibit non-uniform potential distribution of the counter electrodes, reduce luminance unevenness of the display device, and achieve high display quality.

The conductive layer 134 can be formed using a material that can be used for the pixel electrode and the counter electrode. Note that in the case where the conductive layer 134 is provided on a side through which light is extracted in the display device, the conductive layer 134 is preferably formed using a material transmitting visible light.

After that, the protective layer 135 is preferably formed over the conductive layer 134. The materials and the deposition method that can be used for the protective layer 135 are similar to those for the protective layers 131 and 132.

Then, the substrate 120 is bonded to the protective layer 135 with the resin layer 119, whereby the display device 100 illustrated in FIG. 1B can be manufactured.

As described above, in the method for manufacturing a display device of one embodiment of the present invention, the island-shaped EL layers are formed not by using a fine metal mask but by processing an EL layer deposited over the entire surface; thus, the island-shaped EL layers can be formed to have a uniform thickness.

The first layer, the second layer, and the third layer included in the light-emitting devices of the respective colors are formed in separate steps. Accordingly, EL layers can be formed to have structures (a material, a thickness, and the like) appropriate for the light-emitting devices of the respective colors. Thus, the light-emitting devices can have favorable characteristics.

The display device in this embodiment has a structure in which the first layer, the second layer, and the third layer included in the light-emitting devices of the respective colors are inhibited from overlapping with or touching each other. It is thus possible to achieve a display device that has inhibited crosstalk, high resolution or high definition, and high display quality.

This embodiment can be combined with the other embodiments as appropriate. In the case where a plurality of structure examples are described in one embodiment in this specification, the structure examples can be combined as appropriate.

Embodiment 2

In this embodiment, a display device of one embodiment of the present invention is described with reference to FIG. 11 and FIG. 12.

The display device in this embodiment can be a high-definition display device or large-sized display device. Accordingly, the display device of this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 100A]

Figure 11:
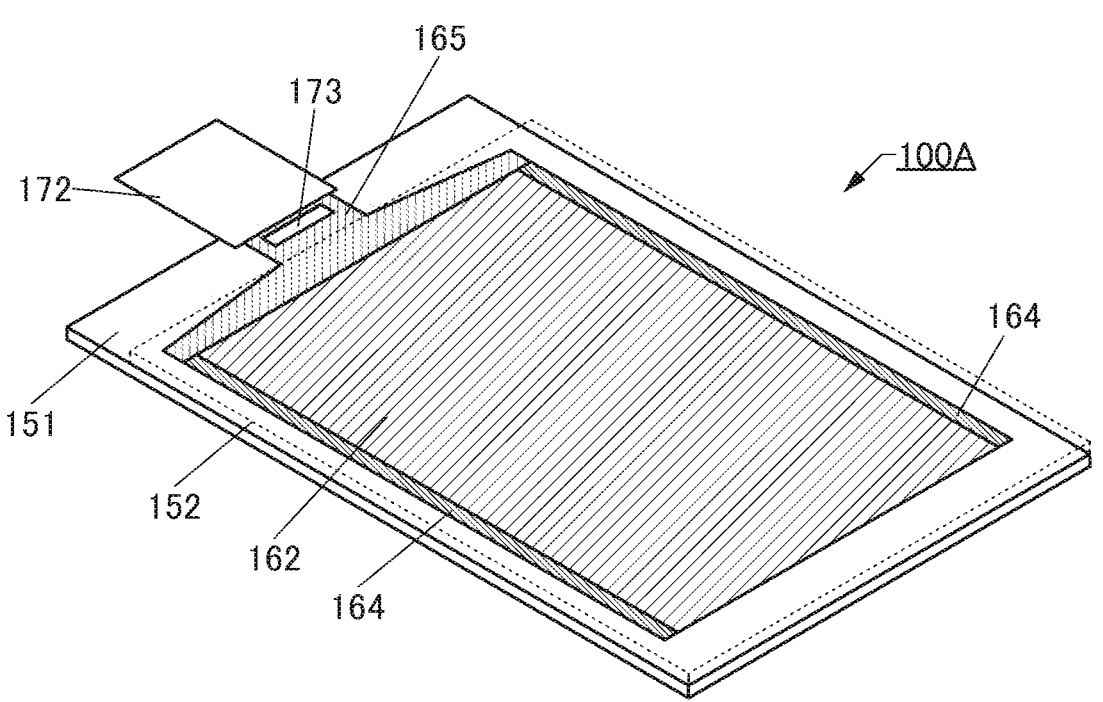
FIG. 11 is a perspective view illustrating an example of a display device.
Figures 12A, 12B, 12C:
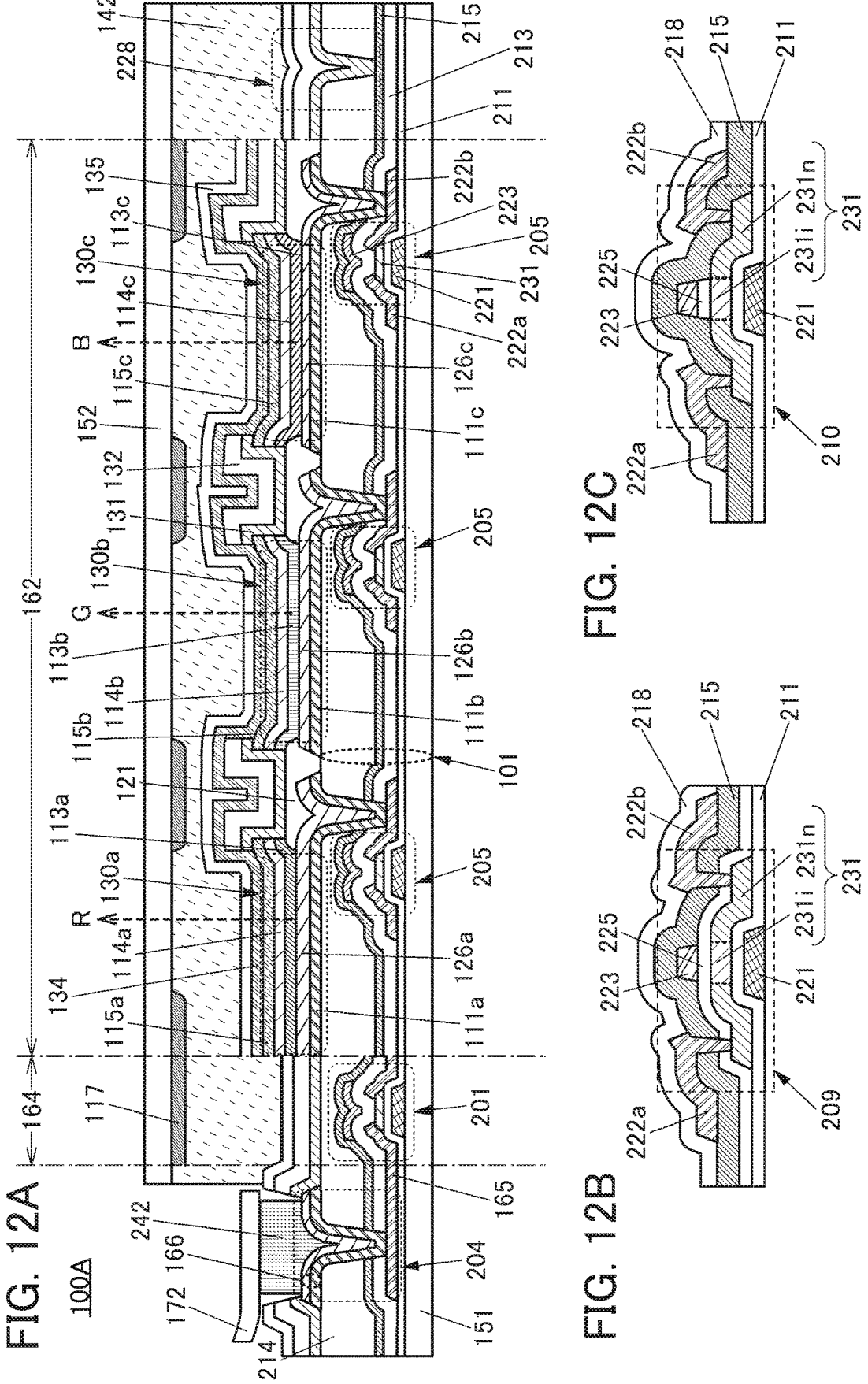
FIG. 12A is a cross-sectional view illustrating an example of a display device.
FIG. 12B and FIG. 12C are cross-sectional views each illustrating an example of a transistor.

FIG. 11 is a perspective view of a display device 100A, and FIG. 12A is a cross-sectional view of the display device 100A.

The display device 100A has a structure where a substrate 152 and a substrate 151 are bonded to each other. In FIG. 11, the substrate 152 is denoted by a dashed line.

The display device 100A includes a display portion 162, a circuit 164, a wiring 165, and the like. FIG. 11 illustrates an example in which an IC 173 and an FPC 172 are mounted on the display device 100A. Thus, the structure illustrated in FIG. 11 can be regarded as a display module including the display device 100A, the IC (integrated circuit), and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 11 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display device 100A and the display module are not necessarily provided with an IC. The IC may be mounted on the FPC by a COF method or the like.

FIG. 12A illustrates an example of cross sections of part of a region including the FPC 172, part of the circuit 164, part of the display portion 162, and part of a region including an end portion of the display device 100A.

The display device 100A illustrated in FIG. 12A includes a transistor 201, a transistor 205, the light-emitting device 130a which emits red light, the light-emitting device 130b which emits green light, the light-emitting device 130c which emits blue light, and the like between the substrate 151 and the substrate 152.

In the case where a pixel of the display device includes three kinds of subpixels including light-emitting devices emitting light of different colors, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

The protective layer 135 and the substrate 152 are bonded to each other with an adhesive layer 142. A solid sealing structure, a hollow sealing structure, or the like can be employed to seal the light-emitting devices. In FIG. 12A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. The adhesive layer 142 may be provided not to overlap with the light-emitting device. The space may be filled with a resin different from that of the frame-like adhesive layer 142.

The light-emitting devices 130a, 130b, and 130c each have the same structure as the stacked-layer structure illustrated in FIG. 1B except that they have an optical adjustment layer between the pixel electrode and the EL layer. The light-emitting device 130a includes an optical adjustment layer 126a, the light-emitting device 130b includes an optical adjustment layer 126b, and the light-emitting device 130c includes an optical adjustment layer 126c. Embodiment 1 can be referred to for the details of the light-emitting devices. End portions of the light-emitting devices 130a, 130b, and 130c are covered with the protective layers 131 and 132. In addition, the conductive layer 134 provided over the light-emitting devices 130a, 130b, and 130c and the protective layer 132 is electrically connected to the counter electrodes 115a, 115b, and 115c. The conductive layer 134, which is provided on a side through which light is extracted, is formed using a material having a high visible-light-transmitting property. The protective layer 135 is provided over the conductive layer 134.

FIG. 12A illustrates an example in which the thickness of the optical adjustment layer 126a is larger than that of the optical adjustment layer 126b and the thickness of the optical adjustment layer 126b is larger than that of the optical adjustment layer 126c. The thickness of each optical adjustment layer is preferably determined in the following manner: the thickness of the optical adjustment layer 126a is set to intensify red light, the thickness of the optical adjustment layer 126b is set to intensify green light, and the thickness of the optical adjustment layer 126c is set to intensify blue light. This achieves a microcavity structure, so that the color purity of light emitted from each light-emitting device can be increased.

The optical adjustment layer is preferably formed using a conductive material transmitting visible light among the conductive materials that can be used for the electrode of the light-emitting device.

The pixel electrodes 111a, 111b, and 111c are each electrically connected to a conductive layer 222b included in the transistor 205 through an opening provided in an insulating layer 214.

End portions of the pixel electrode and the optical adjustment layer are covered with the insulating layer 121. The pixel electrode contains a material that reflects visible light, and the counter electrode contains a material that transmits visible light.

Light from the light-emitting device is emitted toward the substrate 152. For the substrate 152, a material having a high visible-light-transmitting property is preferably used.

A stacked-layer structure including the substrate 151 and the components thereover up to the insulating layer 214 corresponds to the layer 101 including transistors in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that its end portion is positioned on the inner side compared to the end portion of the display device 100A, to prevent the organic insulating film from being exposed at the end portion of the display device 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 12A, an opening is formed in the insulating layer 214. This can inhibit entry of impurities into the display portion 162 from the outside through the insulating layer 214 even when an organic insulating film is used as the insulating layer 214. Consequently, the reliability of the display device 100A can be increased.

Each of the transistor 201 and the transistor 205 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display device of this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

FIG. 12B and FIG. 12C illustrate other structure examples of transistors.

The transistor 209 and the transistor 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the low-resistance regions 231n, the conductive layer 222b connected to the other low-resistance region 231n, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned at least between the conductive layer 223 and the channel formation region 231i. Furthermore, an insulating layer 218 covering the transistor may be provided.

FIG. 12B illustrates an example of the transistor 209 in which the insulating layer 225 covers a top surface and a side surface of the semiconductor layer 231. The conductive layer 222a and the conductive layer 222b are connected to the corresponding low-resistance regions 231n through openings provided in the insulating layer 225 and the insulating layer 215. One of the conductive layer 222a and the conductive layer 222b functions as a source, and the other functions as a drain.

In the transistor 210 illustrated in FIG. 12C, the insulating layer 225 overlaps with the channel formation region 231i of the semiconductor layer 231 and does not overlap with the low-resistance regions 231n. The structure illustrated in FIG. 12C is obtained by processing the insulating layer 225 with the conductive layer 223 as a mask, for example. In FIG. 12C, the insulating layer 215 is provided to cover the insulating layer 225 and the conductive layer 223, and the conductive layer 222a and the conductive layer 222b are connected to the low-resistance regions 231n through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the pixel electrode and a conductive film obtained by processing the same conductive film as the optical adjustment layer 126c. On a top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 152 on the substrate 151 side. A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

The protective layer 131 and the protective layer 132 covering side surfaces of the light-emitting device and the protective layer 135 covering the light-emitting device can inhibit an impurity such as water from entering the light-emitting device, and increase the reliability of the light-emitting device.

In the region 228 in the vicinity of the end portion of the display device 100A, the insulating layer 215 and the protective layer 131, the protective layer 132, or the protective layer 135 are preferably in contact with each other through an opening in the insulating layer 214. In particular, the inorganic insulating films are preferably in contact with each other. This can inhibit entry of impurities into the display portion 162 from the outside through the organic insulating film. Consequently, the reliability of the display device 100A can be enhanced.

For each of the substrate 151 and the substrate 152, glass, quartz, ceramics, sapphire, a resin, a metal, an alloy, a semiconductor, or the like can be used. The substrate on the side from which light from the light-emitting device is extracted is formed using a material that transmits the light. When the substrate 151 and the substrate 152 are formed using a flexible material, the flexibility of the display device can be increased. Furthermore, a polarizing plate may be used as the substrate 151 or the substrate 152.

For each of the substrate 151 and the substrate 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a poly-carbonate (PC) resin, a polyethersulfone (PES) resin, poly-amide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a poly-tetrafluoroethylene (PTFE) resin, an ABS resin, and cellulose nanofiber. Glass that is thin enough to have flexibility may be used for one or both of the substrate 151 and the substrate 152.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further prefer-ably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tung-sten, or an alloy containing any of these metals as its main component can be used, for example. A single-layer struc-ture or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display device, and conductive layers (e.g., a conductive layer functioning as a pixel electrode or a common electrode) included in a light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

This embodiment can be combined with the other embodiments as appropriate.

Embodiment 3

In this embodiment, a display device of one embodiment of the present invention is described with reference to FIG. 13 to FIG. 16.

The display device in this embodiment can be a high-resolution display device. Accordingly, the display device in this embodiment can be used for display portions of infor-mation terminals (wearable devices) such as watch-type and bracelet-type information terminals and display portions of wearable devices capable of being worn on the head, such as a VR device like a head mounted display and a glasses-type AR device.

[Display Module]

Figure 13A:
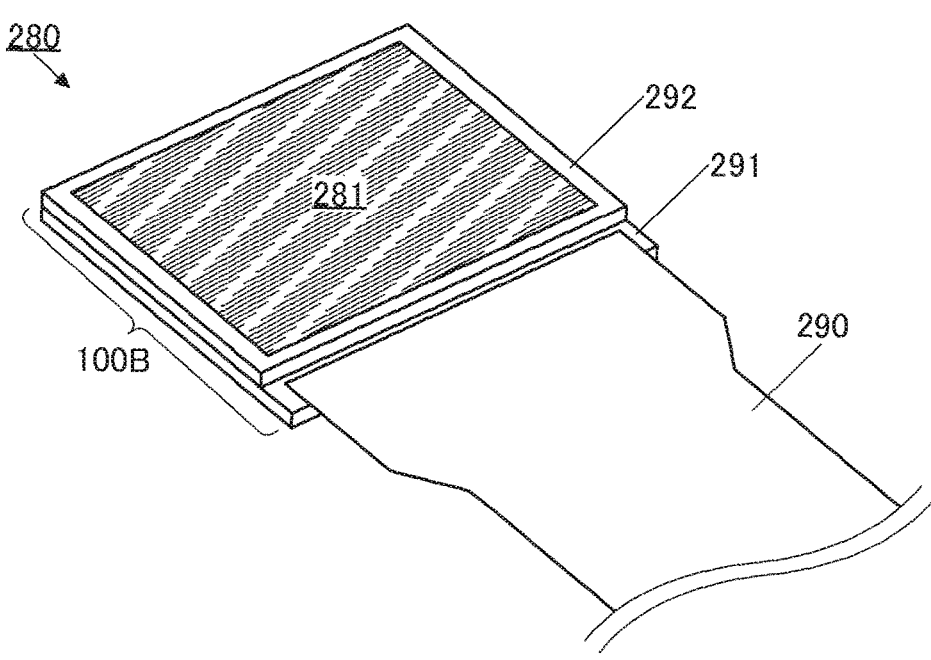
FIG. 13A and FIG. 13B are perspective views illustrating an example of a display module.

FIG. 13A is a perspective view of a display module 280. The display module 280 includes a display device 100B and an FPC 290. Note that the display device included in the display module 280 is not limited to the display device 100B and may be a display device 100C or a display device 100D described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 13B:
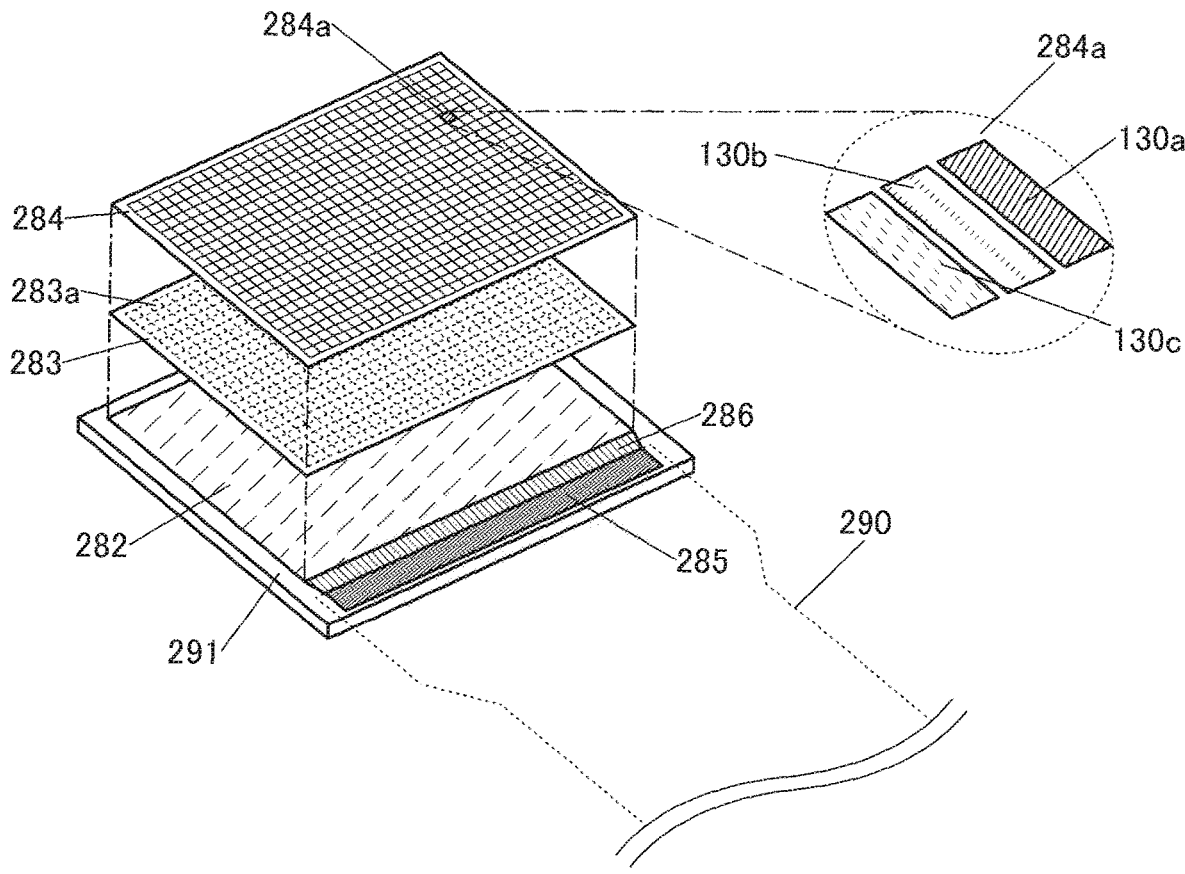

FIG. 13B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 13B. The pixel 284a includes the light-emitting devices 130a, 130b, and 130c that emit light of different colors from each other. A plurality of light-emitting devices may be arranged in a stripe pattern as illustrated in FIG. 13B. Alternatively, a variety of arrange-ment methods of light-emitting devices, such as delta arrangement or pentile arrangement, can be employed.

The pixel circuit portion 283 includes a plurality of pixel circuits 283a arranged periodically.

One pixel circuit 283a is a circuit that controls light emission of three light-emitting devices included in one pixel 284a. One pixel circuit 283a may be provided with three circuits each of which controls light emission of one light-emitting device. For example, the pixel circuit 283a can include at least one selection transistor, one current control transistor (driving transistor), and a capacitor for one light-emitting device. In this case, a gate signal is input to a gate of the selection transistor, and a source signal is input to one of a source and a drain of the selection transistor. Thus, an active-matrix display device is achieved.

The circuit portion 282 includes a circuit for driving the pixel circuits 283a in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are provided to be stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Device 100B]

Figure 14:
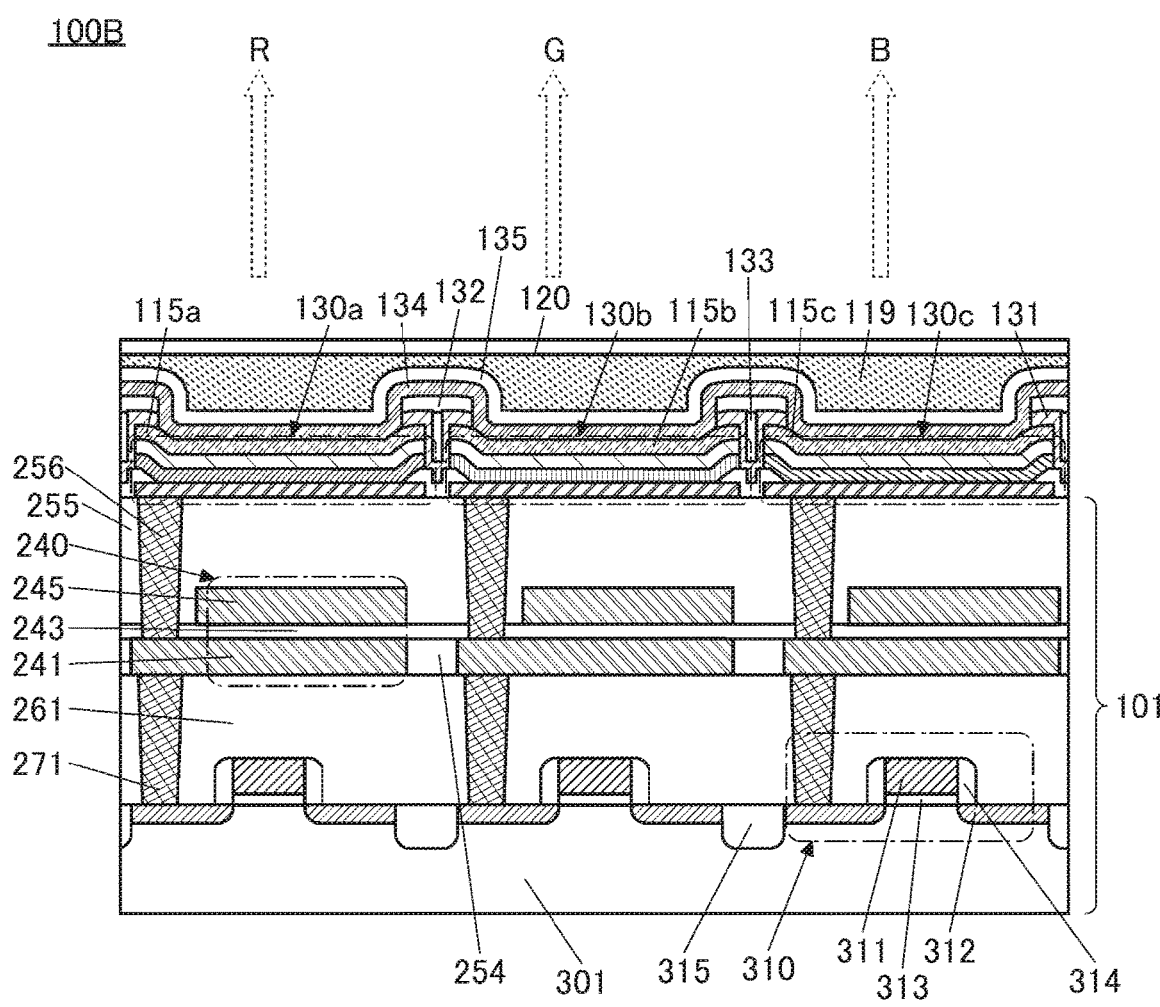
FIG. 14 is a cross-sectional view illustrating an example of a display device.

The display device 100B illustrated in FIG. 14 includes a substrate 301, the light-emitting devices 130a, 130b and 130c, a capacitor 240, and a transistor 310.

The substrate 301 corresponds to the substrate 291 illustrated in FIG. 13A and FIG. 13B. A stacked-layer structure including the substrate 301 and the components thereover up to an insulating layer 255 corresponds to the layer 101 including transistors in Embodiment 1.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover a side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240. The light-emitting devices 130a, 130b, and 130c and the like are provided over the insulating layer 255. This embodiment shows an example in which the light-emitting devices 130a, 130b, and 130c have the same structure as the stacked-layer structure illustrated in FIG. 1B. Furthermore, the protective layers 131 and 132 are provided to cover side surfaces of the light-emitting devices 130a, 130b, and 130c. The conductive layer 134 is provided over the light-emitting devices 130a, 130b, and 130c and the protective layer 132. The conductive layer 134 is electrically connected to the counter electrodes (the counter electrodes 115a, 115b, and 115c) of the light-emitting devices and has a function of electrically connecting the counter electrodes to each other. The protective layer 135 covering the light-emitting devices 130a, 130b, and 130c is provided over the conductive layer 134. The substrate 120 is bonded to the protective layer 135 with the resin layer 119. The space 133 is provided between the protective layer 131 and the protective layer 132. Embodiment 1 can be referred to for details of the light-emitting devices and the components thereover up to the substrate 120. The substrate 120 corresponds to the substrate 292 in FIG. 13A.

The pixel electrode of the light-emitting device is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Device 100C]

Figure 15:
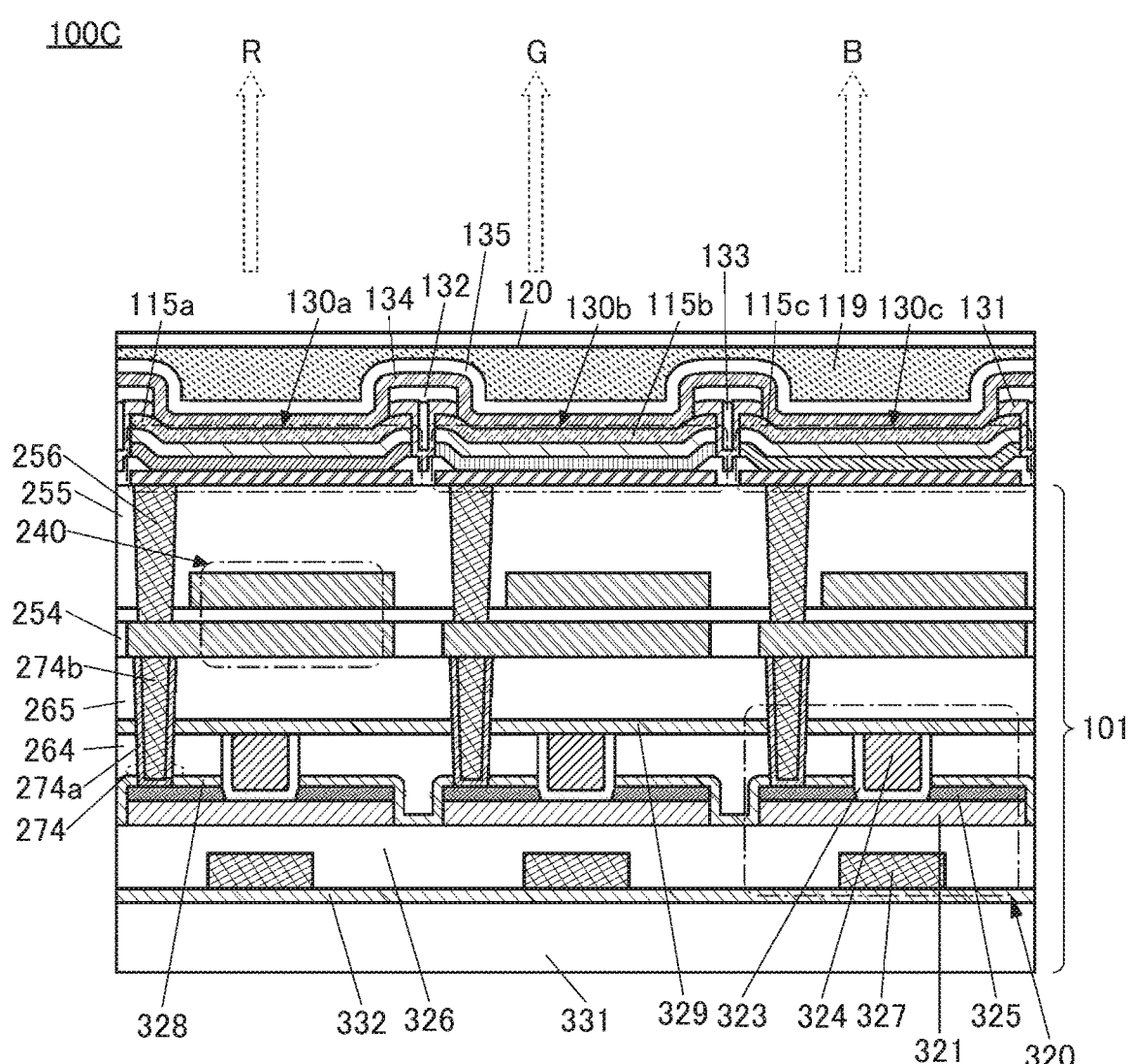
FIG. 15 is a cross-sectional view illustrating an example of a display device.

The display device 100C illustrated in FIG. 15 differs from the display device 100B mainly in a structure of a transistor. Note that portions similar to those in the display device 100B are not described in some cases.

A transistor 320 is a transistor (OS transistor) that contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 13A and FIG. 13B. A stacked-layer structure including the substrate 331 and the components thereover up to the insulating layer 255 corresponds to the layer 101 including transistors in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide (also referred to as an oxide semiconductor) film having semiconductor characteristics is preferably used as the semiconductor layer 321. A material that can be used for the semiconductor layer 321 will be described in detail later.

The pair of conductive layers 325 are provided on and in contact with the semiconductor layer 321 and function as a source electrode and a drain electrode.

An insulating layer 328 is provided to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers a side surface of an opening formed in the insulating layer 265, the insulating layer 329, the insulating layer 264, and the insulating layer 328 and part of the top surface of the conductive layer 325, and a conductive layer 274*b* in contact with the top surface of the conductive layer 274*a*. For the conductive layer 274*a*, a conductive material in which hydrogen and oxygen are less likely to diffuse is preferably used.

The structures of the insulating layer 254 and the components thereover up to the substrate 120 in the display device 100C are similar to those in the display device 100B.

[Display Device 100D]

Figure 16:
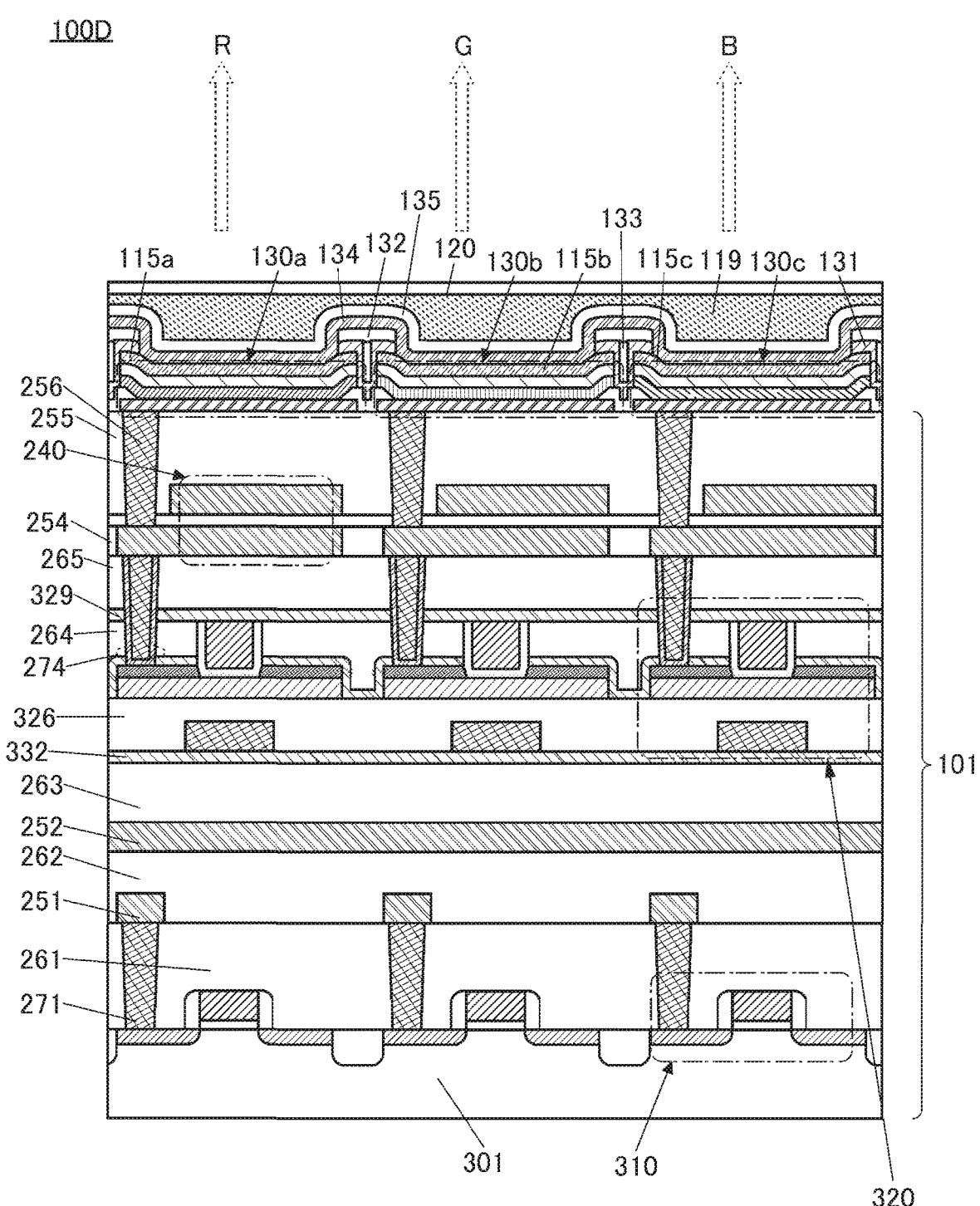
FIG. 16 is a cross-sectional view illustrating an example of a display device.

The display device 100D illustrated in FIG. 16 has a structure in which the transistor 310 whose channel is formed in the substrate 301 and the transistor 320 including a metal oxide in the semiconductor layer where the channel is formed are stacked. Note that portions similar to those in the display devices 100B and 100C are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display device can be downsized as compared with the case where a driver circuit is provided around a display region. This embodiment can be combined with the other embodiments as appropriate.

Embodiment 4

In this embodiment, a light-emitting device that can be used for the display device of one embodiment of the present invention is described.

A light-emitting device illustrated in FIG. 17A includes an electrode 772, an EL layer 786, and an electrode 788. One of the electrode 772 and the electrode 788 functions as an anode and the other functions as a cathode. One of the electrode 772 and the electrode 788 functions as a pixel electrode and the other functions as a common electrode. It is preferable that one of the electrode 772 and the electrode 788, through which light is extracted, transmit visible light and the other reflect visible light.

The EL layer 786 included in the light-emitting device can be formed of a plurality of layers such as a layer 4420, a light-emitting layer 4411, and a layer 4430, as illustrated in FIG. 17A. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can serve as a single light-emitting unit, and the structure in FIG. 17A is referred to as a single structure in this specification.

FIG. 17B is a modification example of the EL layer 786 included in the light-emitting device illustrated in FIG. 17A. Specifically, the light-emitting device illustrated in FIG. 17B includes a layer 4431 over the electrode 772, a layer 4432 over the layer 4431, the light-emitting layer 4411 over the layer 4432, a layer 4421 over the light-emitting layer 4411, a layer 4422 over the layer 4421, and the electrode 788 over the layer 4422. For example, when the electrode 772 functions as an anode and the electrode 788 functions as a cathode, the layer 4431 functions as a hole-injection layer, the layer 4432 functions as a hole-transport layer, the layer 4421 functions as an electron-transport layer, and the layer 4422 functions as an electron-injection layer. Alternatively, when the electrode 772 functions as a cathode and the electrode 788 functions as an anode, the layer 4431 functions as an electron-injection layer, the layer 4432 functions as an electron-transport layer, the layer 4421 functions as a hole-transport layer, and the layer 4422 functions as the hole-injection layer. With such a layer structure, carriers can be efficiently injected to the light-emitting layer 4411, and the efficiency of the recombination of carriers in the light-emitting layer 4411 can be increased.

Note that the structure in which a plurality of light-emitting layers (light-emitting layers 4411, 4412, and 4413) are provided between the layer 4420 and the layer 4430 as illustrated in FIG. 17C is a variation of the single structure.

A structure in which a plurality of light-emitting units (EL layers 786a and 786b) are connected in series with an intermediate layer (also referred to as a charge-generation layer) 4440 therebetween as illustrated in FIG. 17D is referred to as a tandem structure in this specification. Note that one embodiment of the present invention is not limited thereto, and the tandem structure may be referred to as a stack structure. The tandem structure enables a light-emitting device capable of high-luminance light emission.

Note that also in FIG. 17C and FIG. 17D, the layer 4420 and the layer 4430 may each have a stacked-layer structure of two or more layers as illustrated in FIG. 17B.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

The light-emitting device that emits white light preferably contains two or more kinds of light-emitting substances in the light-emitting layer. To obtain white light emission, two or more light-emitting substances may be selected so that their emission colors are complementary. For example, when emission colors of a first light-emitting layer and a second light-emitting layer are complementary colors, the light-emitting device that emits white light as a whole can be obtained. The same applies to a light-emitting device including three or more light-emitting layers. For example, when the light-emitting layers 4411, 4412, and 4413 illustrated in FIG. 17C emit light of complementary colors, a white-light-emitting device with a single structure can be obtained.

The light-emitting layer preferably contains two or more light-emitting substances that emit light of R (red), G (green), B (blue), Y (yellow), O (orange), and the like. Alternatively, the light-emitting layer preferably contains two or more light-emitting substances that emit light containing two or more of color spectral components of R, G, and B.

This embodiment can be combined with the other embodiments as appropriate.

Embodiment 5

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS. Moreover, the second region has [Ga] higher than that in the composition of the CAC-OS. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases. Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 6

In this embodiment, electronic devices of one embodiment of the present invention are described with reference to FIG. 18 to FIG. 22.

An electronic device of this embodiment is provided with the display device of one embodiment of the present invention in a display portion. The display device of one embodiment of the present invention can be easily increased in resolution and definition. Thus, the display device of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, a display device of one embodiment of the present invention can have a high resolution, and thus can be favorably used for an electronic device having a relatively small display portion. Examples of such an electronic device include a watch-type or a bracelet-type information terminal device (wearable device), and a wearable device worn on a head, such as a device for VR such as a head mounted display, a glasses-type device for AR, and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display device of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display device with high definition and high resolution, the electronic device can have higher realistic sensation, sense of depth, and the like in personal use such as portable use and home use. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIG. 18A, FIG. 18B, FIG. 19A, and FIG. 19B. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

An electronic device 700A illustrated in FIG. 18A and an electronic device 700B illustrated in FIG. 18B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panel 751. Thus, the electronic device can perform display with extremely high resolution.

The electronic device 700A and the electronic device 700B can each project an image displayed on the display panel 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be detected and an image corresponding to the orientation can be displayed on the display region 756.

The communication portion includes a wireless communication device, and a video signal and the like can be supplied by the wireless communication device. Note that instead of or in addition to the wireless communication device, a connector to which a cable for supplying a video signal and/or a power supply potential can be connected may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be applied to the touch sensor module. Any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

An electronic device 800A illustrated in FIG. 19A and an electronic device 800B illustrated in FIG. 19B each include a pair of display portions 820, a housing 821, a communication portion 822, a pair of wearing portions 823, a control portion 824, a pair of image capturing portions 825, and a pair of lenses 832.

A display device of one embodiment of the present invention can be used in the display portions 820. Thus, the electronic device can perform display with extremely high resolution. This enables a user to feel high sense of immersion.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions 823. FIG. 19A or the like illustrates an example in which the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be applied to any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 18A has a function of transmitting information to the earphones 750 with the wireless communication function. As another example, the electronic device 800A illustrated in FIG. 19A has a function of transmitting information to the earphones 750 with the wireless communication function.

The electronic device may include an earphone portion. The electronic device 700B illustrated in FIG. 18B includes earphone portions 727. For example, a structure in which the earphone portions 727 and the control portion are connected to each other by wire may be employed. Part of a wiring that connects the earphone portions 727 and the control portion may be positioned inside the housing 721 or the wearing portion 723.

Similarly, the electronic device 800B illustrated in FIG. 19B includes earphone portions 827. For example, a structure in which the earphone portions 827 and the control portion 824 are connected to each other by wire may be employed. Part of a wiring that connects the earphone portions 827 and the control portion 824 may be positioned inside the housing 821 or the wearing portion 823. The earphone portions 827 and the wearing portion 823 may include magnets. This is preferable because the earphone portions 827 can be fixed to the wearing portion 823 with magnetic force and thus can be easily housed.

Note that the electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 20A:
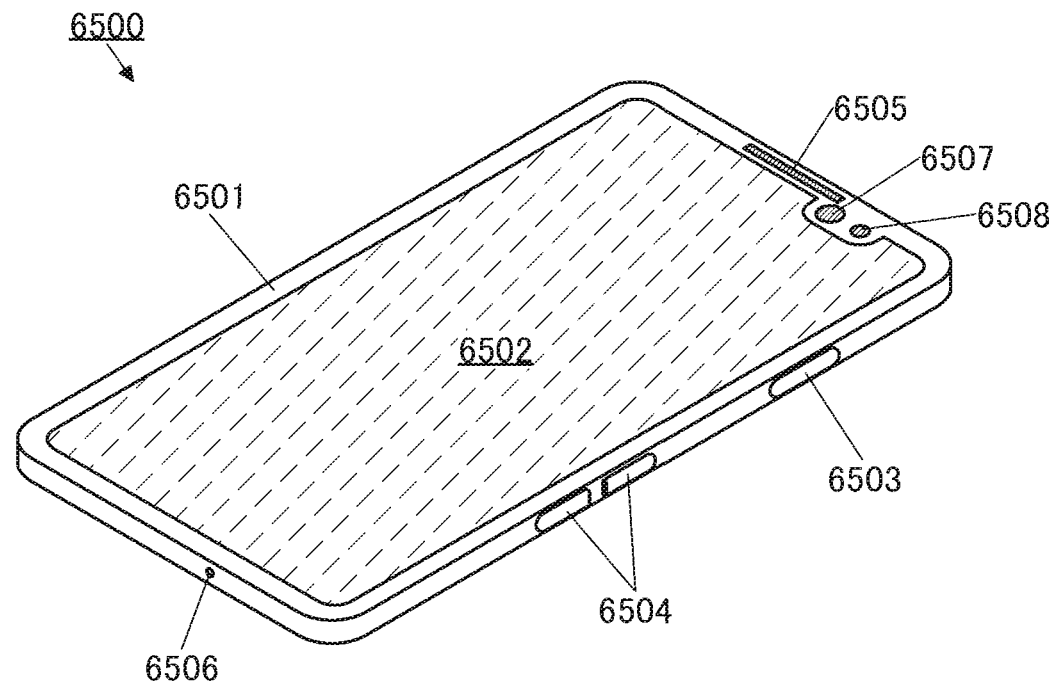
FIG. 20A and FIG. 20B are diagrams illustrating an example of an electronic device.

An electronic device 6500 illustrated in FIG. 20A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 20B:
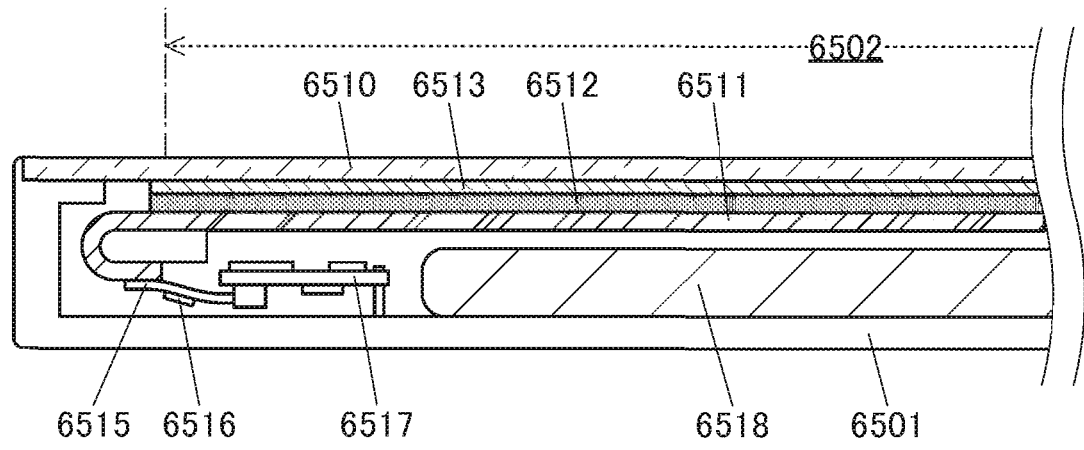

FIG. 20B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the pixel portion, whereby an electronic device with a narrow bezel can be achieved.

FIG. 21A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 21A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 21B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

FIG. 21C and FIG. 21D illustrate examples of digital signage.

Digital signage 7300 illustrated in FIG. 21C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 21D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 21C and FIG. 21D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 21C and FIG. 21D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 22A to FIG. 22F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display device of one embodiment of the present invention can be used for the display portion 9001 in FIG. 22A to FIG. 22F.

The electronic devices illustrated in FIG. 22A to FIG. 22F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 22A to FIG. 22F are described in detail below.

FIG. 22A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 22A illustrates an example in which three icons 9050 are displayed. Furthermore, information 9051 indicated by dashed rectangles can be displayed on another surface of the display portion 9001. Examples of the information 9051 include notification of reception of an e-mail, an SNS (social networking service) message, or an incoming call, the title and sender of an e-mail, an SNS message, or the like, the date, the time, remaining battery, and the radio field intensity. Alternatively, the icon 9050 or the like may be displayed at the position where the information 9051 is displayed.

FIG. 22B is a perspective view illustrating a portable information terminal 9102. The portable information terminal 9102 has a function of displaying information on three or more surfaces of the display portion 9001. Shown here is an example in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 22C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 22D to FIG. 22F are perspective views illustrating a foldable portable information terminal 9201. FIG. 22D is a perspective view of an opened state of the portable information terminal 9201, FIG. 22F is a perspective view of a folded state thereof, and FIG. 22E is a perspective view of a state in the middle of change from one of FIG. 22D and FIG. 22F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate.

REFERENCE NUMERALS

100A: display device, 100B: display device, 100C: display device, 100D: display device, 100: display device, 101: layer including transistor, 110*a*: subpixel, 110*b*: subpixel, 110*c*: subpixel, 110: pixel, 111*a*: pixel electrode, 111*b*: pixel electrode, 111*c*: pixel electrode, 113A: first layer, 113*a*: first layer, 113B: second layer, 113*b*: second layer, 113C: third layer, 113*c*: third layer, 114*a*: fourth layer, 114*b*: fourth layer, 114*c*: fourth layer, 114: fourth layer, 115*a*: counter electrode, 115*b*: counter electrode, 115*c*: counter electrode, 115*d*: conductive layer, 115: counter electrode, 117: light-blocking layer, 118A: first sacrificial layer, 118*a*: first sacrificial layer, 118B: second sacrificial layer, 118*b*: second sacrificial layer, 118C: third sacrificial layer, 118*c*: third sacrificial layer, 119: resin layer, 120: substrate, 121: insulating layer, 123: conductive layer, 126*a*: optical adjustment layer, 126*b*: optical adjustment layer, 126*c*: optical adjustment layer, 130*a*: light-emitting device, 130*b*: light-emitting device, 130*c*: light-emitting device, 131: protective layer, 132: protective layer, 133: space, 134: conductive layer, 135: protective layer, 140: connection portion, 142: adhesive layer, 151: substrate, 152: substrate, 162: display portion, 164: circuit, 165: wiring, 166: conductive layer, 172: FPC, 173: IC, 190*a*: resist mask, 190*b*: resist mask, 190*c*: resist mask, 190*d*: resist mask, 190*e*: resist mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231*i*: channel formation region, 231*n*: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 700A: electronic device, 700B: electronic device, 721: housing, 723: wearing portion, 727: earphone portion, 750: earphone, 751: display panel, 753: optical member, 756: display region, 757: frame, 758: nose pad, 772: electrode, 786*a*: EL layer, 786*b*: EL layer, 786: EL layer, 788: electrode, 800A: electronic device, 800B: electronic device, 820: display portion, 821: housing, 822: communication portion, 823: wearing portion, 824: control portion, 825: image capturing portion, 827: earphone portion, 832: lens, 4411: light-emitting layer, 4412: light-emitting layer, 4413: light-emitting layer, 4420: layer, 4421: layer, 4422: layer, 4430: layer, 4431: layer, 4432: layer, 4440: intermediate layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A method for manufacturing a display device, comprising:

forming a plurality of first pixel electrodes aligned in a first direction and a plurality of second pixel electrodes aligned in the first direction so that the plurality of first pixel electrodes and the plurality of second pixel electrodes are aligned in a second direction;

forming a first layer over the plurality of first pixel electrodes and the plurality of second pixel electrodes;

forming a first sacrificial layer over the first layer;

processing the first layer and the first sacrificial layer to expose at least part of each of the plurality of second pixel electrodes;

forming a second layer over the plurality of first pixel electrodes and the plurality of second pixel electrodes;

forming a second sacrificial layer over the second layer;

processing the second layer and the second sacrificial layer to expose at least part of the first sacrificial layer;

removing the first sacrificial layer and the second sacrificial layer;

forming a third layer over the plurality of first pixel electrodes and the plurality of second pixel electrodes;

forming a counter electrode over the third layer;

processing the third layer and the counter electrode to remove at least part of each of the third layer and the counter electrode included in a region between the first pixel electrode and the second pixel electrode, a region between the plurality of first pixel electrodes, and a region between the plurality of second pixel electrodes in a top view;

forming a protective layer over the counter electrode;

processing the protective layer to expose at least part of the counter electrode that overlaps with the first pixel electrode and at least part of the counter electrode that overlaps with the second pixel electrode; and forming a conductive layer over the counter electrode and the protective layer.

2. The method for manufacturing a display device, according to claim 1, wherein as the protective layer, a first protective layer is formed by a first deposition method and a second protective layer is formed by a second deposition method, and wherein the first deposition method is a deposition method that allows a film to be formed at higher coverage than the second deposition method.

3. The method for manufacturing a display device, according to claim 1, wherein before the formation of the first layer, an insulating layer covering end portions of the plurality of first pixel electrodes and end portions of the plurality of second pixel electrodes is formed, and wherein at least part of the insulating layer is exposed in the step of processing the third layer and the counter electrode.

4. The method for manufacturing a display device, according to claim 1, wherein a first resist mask overlapping with the first pixel electrode is formed over the first sacrificial layer, wherein the first resist mask is used in the processing of the first layer and the first sacrificial layer, wherein a second resist mask overlapping with the second pixel electrode is formed over the second sacrificial layer, and wherein the second resist mask is used in the processing of the second layer and the second sacrificial layer.

5. The method for manufacturing a display device, according to claim 1, wherein a third resist mask is formed over the counter electrode, the third resist mask comprising a first part overlapping with the first pixel electrode and a second part overlapping with the second pixel electrode and apart from the first part, and wherein the third resist mask is used in the processing of the third layer and the counter electrode.

6. The method for manufacturing a display device, according to claim 1, wherein a fourth resist mask is formed over the protective layer, the fourth resist mask comprising an opening in a region overlapping with the first pixel electrode and in a region overlapping with the second pixel electrode, and wherein the fourth resist mask is used in the processing of the protective layer.

7. A display device comprising:

a plurality of first light-emitting devices and a plurality of second light-emitting devices;

a protective layer over the plurality of first light-emitting devices and the plurality of second light-emitting devices; and a conductive layer over the protective layer, wherein the first light-emitting devices each comprise a first pixel electrode, a first layer over the first pixel electrode, a third layer over the first layer, and a counter electrode over the third layer, wherein the second light-emitting devices each comprise a second pixel electrode, a second layer over the second pixel electrode, the third layer over the second layer, and the counter electrode over the third layer, wherein the first light-emitting devices and the second light-emitting devices are configured to emit light of different colors from each other, wherein a region between the first pixel electrode and the second pixel electrode in a top view comprises a first part where the third layer and the counter electrode are not provided, wherein a region between two first pixel electrodes in the top view comprises a second part where the third layer and the counter electrode are not provided, wherein a region between two second pixel electrodes in the top view comprises a third part where the third layer and the counter electrode are not provided, wherein the counter electrode is electrically connected to the conductive layer in a region overlapping with the first pixel electrode or the second pixel electrode, and wherein the protective layer comprises a portion covering a top end portion of the counter electrode.

8. The display device according to claim 7, wherein a space surrounded by the protective layer is included between the first light-emitting device and the second light-emitting device.

9. The display device according to claim 7, wherein the protective layer comprises a first protective layer over the counter electrode and a second protective layer over the first protective layer, and wherein a space surrounded by the first protective layer and the second protective layer is included between the first light-emitting device and the second light-emitting device.

10. A display module comprising:

the display device according to claim 7; and at least one of a connector and an integrated circuit.

11. An electronic device comprising:

the display module according to claim 10; and at least one of a housing, a battery, a camera, a speaker, and a microphone.

12. The display device according to claim 7, wherein the conductive layer is configured to be an auxiliary wiring.

13. The display device according to claim 7, further comprising an insulating layer, wherein the insulating layer comprises a portion covering a top end portion of the first pixel electrode and a top end portion of the second pixel electrode.

14. The display device according to claim 7,
wherein the protective layer is in contact with a side
surface of the first layer, a side surface of the second
layer, a side surface of the third layer, and a side surface
of the counter electrode.

15. The display device according to claim 9,
wherein the first protective layer is in contact with a side
surface of the first layer, a side surface of the second
layer, a side surface of the third layer, and a side surface
of the counter electrode.

\* \* \* \* \*